United States Patent
Ohtsuka et al.

(10) Patent No.: US 7,206,217 B2
(45) Date of Patent: *Apr. 17, 2007

(54) NON-VOLATILE FLIP FLOP

(75) Inventors: Takashi Ohtsuka, Toyonaka (JP); Hideyuki Tanaka, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 157 days.

This patent is subject to a terminal disclaimer.

(21) Appl. No.: 10/754,058

(22) Filed: Jan. 9, 2004

(65) Prior Publication Data

US 2004/0141363 A1  Jul. 22, 2004

(30) Foreign Application Priority Data

Apr. 10, 2002 (JP) .............................. 2002-107607

(51) Int. Cl.
*G11C 11/40* (2006.01)
(52) U.S. Cl. ...................... 365/154; 365/148; 365/158; 365/185.08
(58) Field of Classification Search ........... 365/185.08, 365/148, 163
See application file for complete search history.

(56) References Cited

U.S. PATENT DOCUMENTS

| | | | |
|---|---|---|---|
| 4,408,303 A * | 10/1983 | Guterman et al. ..... | 365/185.07 |
| 4,809,225 A * | 2/1989 | Dimmler et al. ............ | 365/149 |
| 5,390,143 A | 2/1995 | Manning | |
| 6,240,013 B1 | 5/2001 | Nishimura | |
| 6,285,575 B1 | 9/2001 | Miwa | |
| 6,426,891 B1 | 7/2002 | Katori | |
| 6,633,497 B2 * | 10/2003 | Nickel .................. | 365/158 |
| 6,717,844 B1 * | 4/2004 | Ohtani .................. | 365/158 |
| 6,847,543 B2 * | 1/2005 | Toyoda et al. ............. | 365/154 |
| 6,862,226 B2 * | 3/2005 | Toyoda et al. ......... | 365/189.07 |

FOREIGN PATENT DOCUMENTS

| | | |
|---|---|---|
| JP | 58-6178 | 1/1983 |
| JP | 62-206977 | 9/1987 |
| JP | 05-090532 | 4/1993 |
| JP | 07-226088 | 8/1995 |
| JP | 2000-048576 A | 2/2000 |
| JP | 2000-293889 A | 10/2000 |
| WO | WO 00/57498 | 9/2000 |

* cited by examiner

*Primary Examiner*—Tan T. Nguyen
(74) *Attorney, Agent, or Firm*—McDermott Will & Emery LLP

(57) ABSTRACT

A non-volatile flip flop according to the invention comprising: a flip flop section (4) having a pair of memory nodes (5, 6) for storing a pair of inverse logic data elements; and a pair of non-volatile resistance change elements (11, 12) which are connected to the pair of memory nodes (5, 6) through switching elements (9, 10) respectively and the resistances of which vary so as to be retainable, wherein, in a store operation, the resistances of the pair of non-volatile resistance change elements (11, 12) can be varied according to the respective potentials of the pair of memory nodes (5, 6) and, in a recall operation, the pair of memory nodes (5, 6) can be placed at potentials respectively according to the difference in resistance between the pair of non-volatile resistance change elements (11, 12).

21 Claims, 13 Drawing Sheets

NON-VOLATILE FLIP FLOP

This is a continuation application under 35 U.S.C.111(a) of pending prior International Application No.PCT/JP03/04204, filed on Apr. 2, 2003.

FIELD OF THE INVENTION

The present invention relates to a non-volatile flip flop which performs high speed operations using a flip flop under normal operating conditions and performs a non-volatile operation using resistance change elements with the electric power turned off.

BACKGROUND OF THE INVENTION

With the latest popularization of mobile terminals, there have been an increasing demand for miniaturization of semiconductor devices and low power consumption. Under the circumstances, there have arisen a strong need for non-volatile memories for use in such mobile terminals.

As a non-volatile memory, flush memories and ferroelectric random access memories (FeRAM) have presently come into practical use. Since miniaturization of mobile terminals needs to be promoted, a non-volatile memory is sometimes incorporated in a silicon device.

In data processing elements having silicon as a main constituent, not only miniaturization and low power consumption but also high speed operation is required, and therefore, it becomes a task to find how to perform high speed data processing with a small-sized device and low power consumption.

Typical flash memories working as a non-volatile memory perform writing operation at slow speeds and require high voltage. Therefore, they are not suited for use as a non-volatile memory housed in a mobile terminal.

On the other hand, ferroelectric random access memories can perform higher speed operation with lower power consumption, compared to flash memories. However, ferroelectric random access memories present the problem that when they are incorporated in a silicon device, the decomposition temperature of ferroelectric substances is high and a precious metal such as platinam (Pt) is required for forming the electrodes, resulting in an increase in the processing cost.

In cases where a non-volatile memory is not incorporated in a silicon device and a circuit is constructed with an externally disposed non-volatile memory, the packaging area required increases so that a miniaturized and lightweight device cannot be attained. Another problem is such that since the operation speed of a logic device composed of a silicon device is higher than that of the non-volatile memory, the input/output of data to and from the non-volatile memory causes speed overhead.

As a circuit configuration which combines the advantages of high speed operation by a silicon device and the non-volatility of a non-volatile memory, there have been proposed non-volatile circuits such as disclosed in Japanese Patent Kokai Publications No. 2000-293889 and No. 2000-48576.

According to these publications, a flip flop (FF) circuit commonly used in a silicon device and a ferroelectric capacitor are combined and high speed operations are performed under normal operating conditions similarly to the conventional silicon logic devices and when the need arises, writing of data into the ferroelectric capacitor is performed.

The details of Japanese Patent Kokai Publications No. 2000-293889 will be described below. FIG. 13 is a circuit diagram showing a configuration of a prior art non-volatile memory. As shown in FIG. 13, two inverters 101, 102 constitute a flip flop 103 with their inputs and outputs being connected to each other. In the flip flop 103, two nodes Q0, Q1 are connected to bit lines BLN, BLT through NMOS transistors M0, M1 respectively, the NMOS transistors functioning as a transfer gate. The gate electrodes of the NMOS transistors M0, M1 are connected to a common word line WL.

Ferroelectric capacitors F0, F1, which are connected to a common plate line PL at one end, are connected to the nodes Q0, Q1 respectively. The plate line PL is connected to a plate line driving circuit 104.

Although Japanese Patent Kokai Publication No. 2000-48576 uses FETs provided between the node Q0 and the ferroelectric capacitor F0 and between the node Q1 and the ferroelectric capacitor F1, the basic configuration employing the ferroelectric capacitors F0, F1 is common to these publications No. 2000-293889 and No. 2000-48576.

The conventional non-volatile memories of the above-described structures perform operations similar to those of general flip flops under normal operating conditions. When electric power is turned OFF, writing (storing) of data into the ferroelectric capacitors F0, F1 is executed. In this case, the plate line PL which is normally set to ½Vcc (power source voltage) is set to Vcc, so that opposite electric fields are applied to the pair of ferroelectric capacitors F0, F1 respectively according to the potentials of the nodes Q0, Q1. Accordingly, the pair of ferroelectric capacitors F0, F1 are oppositely polarized.

On the other hand, when performing readout (recalling) from the ferroelectric capacitors F0, F1, the potential at the plate line PL is raised simultaneously with turning ON of the power source. In this case, polarization inversion occurs in either of the pair of ferroelectric capacitors F0, F1, while no polarization inversion occurs in the other ferroelectric capacitor, depending on the polarization conditions. As a result, the effective capacitances of the ferroelectric capacitors F0, F1 differ from each other, causing a difference between the degrees of potential rises in the nodes Q0, Q1, the potential rises being caused by the potential rise in the plate line PL. By resetting the potential at the flip flop 103, utilizing the above difference, the recall operation is completed.

The prior art described above has, however, revealed the following drawbacks. First, ferroelectric substances require high deposition temperature as noted earlier and are vulnerable to reduction atmosphere. Therefore, there arises a need for additional processes such as an etching process in the fabrication of a device, an oxidation process after a hydrogen reduction process, and formation of barrier layers for preventing reduction caused by hydrogen. This leads not only to an increase in the production cost but also to a failure in miniaturization.

Secondly, there is a need to control a voltage to be applied to each ferroelectric substance. Generally, polarization inversion occurs if the electric field of the ferroelectric substance exceeds a certain threshold electric field (coercive electric field), and this polarization condition is utilized to determine whether or not data exists. However, polarization inversion sometimes occurs even when the electric field does not exceed the coercive electric field. Therefore, if a voltage is applied to each ferroelectric substance in other occasions than the store operation and the recall operation, the polarization condition slightly changes in some cases even if the electric field of the ferroelectric substance is no more than the coercive electric field. If such a change in the polarization condition is repeated, the polarization condition is destroyed. This is the phenomenon called "disturb". To avoid "disturb", the voltage applied to each ferroelectric substance needs to be controlled.

In cases where the nodes Q0, Q1 of the flip flop 103 are directly connected to the ferroelectric capacitors F0, F1 respectively as shown in FIG. 13, the wiring capacity of each node Q0 (Q1) increases. In addition, during the operation of the flip flop 103, an electric field is applied to each node Q0 (Q1) by way of the ferroelectric capacitor F0 (F1), the plane line PL and another ferroelectric capacitor. Therefore, a leak current exists in these routes. Generally, a ferroelectric capacitor generates a leak current greater than those of insulating films and interlayer films used for a silicon device composed of, for instance, $SiO_2$. During the operation of the flip flop 103, the polarization of the nodes Q0, Q1 is frequently inverted so that a leak current is generated in a forward direction or reverse direction whenever the polarization of the nodes is inverted.

Fourthly, since it is necessary to fixedly set the plate line PL to ½Vcc even during the operation of the flip flop under normal operating conditions, satisfactory power saving cannot be achieved.

SUMMARY OF THE INVENTION

The invention has been directed to overcoming the foregoing drawbacks and a primary object of the invention is therefore to provide a non-volatile flip flop and its control method, the flip flop using resistance change elements thereby to reduce leak current during normal operation and perform electrically stable operation.

The above object can be accomplished by a non-volatile flip flop according to the invention, comprising:

a flip flop section having a pair of memory nodes for storing a pair of inverse logic data elements; and a pair of non-volatile resistance change elements which are connected to the pair of memory nodes respectively and the resistances of which vary so as to be retainable, wherein, in a store operation, the resistances of the pair of non-volatile resistance change elements can be varied according to the respective potentials of the pair of memory nodes and, in a recall operation, the pair of memory nodes can be placed at potentials respectively according to the difference in resistance between the pair of non-volatile resistance change elements.

Herein, "the resistances vary so as to be retainable" means that even if energy supplied from outside to vary resistances is cut off, the resistances which have been varied are substantially retained. That is, the memory is non-volatile.

Preferably, the non-volatile flip flop of the invention is designed such that in the store operation, either of the pair of non-volatile resistance change elements is brought into a high resistance state whereas the other is brought into a low resistance state according to the respective potentials of the pair of memory nodes and such that in the recall operation, either of the pair of memory nodes is placed at a high potential whereas the other is placed at a low potential according to the difference in resistance between the pair of non-volatile resistance change elements.

Preferably, the non-volatile flip flop of the invention is designed such that the pair of non-volatile resistance change elements are made from a phase change material which is in a high resistance state when it is in an amorphous state and is in a low resistance state when it is in a crystalline state.

Preferably, the non-volatile flip flop of the invention is designed such that, in the store operation, either of the pair of non-volatile resistance change elements is in the amorphous state while the other is in the crystalline state.

Preferably, the non-volatile flip flop of the invention is designed such that a pair of switching elements are sandwiched between the pair of memory nodes and the pair of non-volatile resistance change elements, such that the pair of non-volatile resistance change elements are connected to a plate line, such that either of the pair of memory nodes is at a high potential while the other being at a low potential, and such that by turning the pair of switching elements ON to cause a potential difference between the pair of memory nodes and the plate line, either of the pair of non-volatile resistance change elements is brought into the amorphous state and the other is brought into the crystalline state.

Preferably, the non-volatile flip flop of the invention is designed such that after both of the pair of non-volatile resistance change elements are brought into the amorphous state by causing a potential difference between the pair of memory nodes and the plate line, the state of either of the pair of non-volatile resistance change elements is changed to the crystalline state, whereby either of the pair of non-volatile resistance change elements is brought into the amorphous state while the other is brought into the crystalline state.

Preferably, the non-volatile flip flop of the invention is designed such that a potential difference is produced between both ends of the other non-volatile resistance change element sandwiched between the other memory node maintained at a low potential and the plate line by applying a high potential voltage to the plate line, while the other non-volatile resistance change element is brought into the amorphous state by applying a voltage having a high pulse width to the other non-volatile resistance change element, and a potential difference is produced between both ends of the one non-volatile resistance change element sandwiched between the one memory node maintained at a high potential and the plate line by applying a low potential voltage to the plate line, while the one non-volatile resistance change element is brought into the amorphous state by applying a voltage having a high pulse width to the one non-volatile resistance change element, whereby the pair of non-volatile resistance change elements are both brought into the amorphous state.

Preferably, the non-volatile flip flop of the invention is designed such that a potential difference is produced between both ends of the one non-volatile resistance change element sandwiched between the one memory node maintained at a high potential and the plate line by applying a low potential voltage to the plate line, while the one non-volatile resistance change element is brought into the amorphous state by applying a voltage having a high pulse width to the one non-volatile resistance change element, and a potential difference is produced between both ends of the other non-volatile resistance change element sandwiched between the other memory node maintained at a low potential and the plate line by applying a high potential voltage to the plate line, while the other non-volatile resistance change element is brought into the amorphous state by applying a voltage having a high pulse width to the other non-volatile resistance change element, whereby the pair of non-volatile resistance change elements are both brought into the amorphous state.

Preferably, the non-volatile flip flop of the invention is designed such that a potential difference is produced between both ends of the one of the pair of non-volatile resistance change elements both of which are in the amorphous state, by applying a low potential voltage to the plate line, the one element being sandwiched between the one memory node maintained at a high potential and the plate line, while the one non-volatile resistance change element is brought into the crystalline state by applying a voltage having a low pulse width to the one non-volatile resistance change element, whereby the state of either of the pair of non-volatile resistance change elements is changed to the crystalline state.

Preferably, the non-volatile flip flop of the invention is designed such that wherein a potential difference is produced between both ends of the other one of the pair of non-volatile resistance change elements both of which are in the amorphous state, by applying a high potential voltage to the plate line, the other element being sandwiched between the other memory node maintained at a low potential and the plate line, while the other non-volatile resistance change element is brought into the crystalline state by applying a voltage having a low pulse width to the other non-volatile resistance change element, whereby the state of either of the pair of non-volatile resistance change elements is changed to the crystalline state.

Preferably, the non-volatile flip flop of the invention is designed such that after both of the non-volatile resistance change elements are brought into the crystalline state by producing a potential difference between the pair of memory nodes and the plate line, the state of either of the pair of non-volatile resistance change elements is changed to the amorphous state, whereby either of the pair of non-volatile resistance change elements is brought into the amorphous state while the other element is brought into the crystalline state.

Preferably, the non-volatile flip flop of the invention is designed such that a potential difference is produced between both ends of the other non-volatile resistance change element sandwiched between the other memory node maintained at a low potential and the plate line by applying a high potential voltage to the plate line, while the other non-volatile resistance change element is brought into the crystalline state by applying a voltage having a low pulse width to the other non-volatile resistance change element, and a potential difference is produced between both ends of the one non-volatile resistance change element sandwiched between the one memory node maintained at a high potential and the plate line by applying a low potential voltage to the plate line, while the one non-volatile resistance change element is brought into the crystalline state by applying a voltage having a low pulse width to the one non-volatile resistance change element, whereby the pair of non-volatile resistance change elements are both brought into the crystalline state.

Preferably, the non-volatile flip flop of the invention is designed such that a potential difference is produced between both ends of the one non-volatile resistance change element sandwiched between the one memory node maintained at a high potential and the plate line by applying a low potential voltage to the plate line, while the one non-volatile resistance change element is brought into the crystalline state by applying a voltage having a low pulse width to the one non-volatile resistance change element, and a potential difference is produced between both ends of the other non-volatile resistance change element sandwiched between the other memory node maintained at a low potential and the plate line by applying a high potential voltage to the plate line, while the other non-volatile resistance change element is brought into the crystalline state by applying a voltage having a low pulse width to the other non-volatile resistance change element, whereby the pair of non-volatile resistance change elements are both brought into the crystalline state.

Preferably, the non-volatile flip flop of the invention is designed such that a potential difference is produced between both ends of the one of the pair of non-volatile resistance change elements both of which are in the crystalline state, by applying a low potential voltage to the plate line, the one element being sandwiched between the one memory node maintained at a high potential and the plate line, while the one non-volatile resistance change element is brought into the amorphous state by applying a voltage having a high pulse width to the one non-volatile resistance change element, whereby the state of either of the pair of non-volatile resistance change elements is changed to the amorphous state.

Preferably, the non-volatile flip flop of the invention is designed such that a potential difference is produced between both ends of the other one of the pair of non-volatile resistance change elements both of which are in the crystalline state, by applying a high potential voltage to the plate line, the other element being sandwiched between the other memory node maintained at a low potential and the plate line, while the other non-volatile resistance change element is brought into the amorphous state by applying a voltage having a high pulse width to the other non-volatile resistance change element, whereby the state of either of the pair of non-volatile resistance change elements is changed to the amorphous state.

Preferably, the non-volatile flip flop of the invention is designed such that, in the recall operation, the pair of switching elements are turned ON, the potential at the plate line is raised from ground potential to power source potential, and a power source for the flip flop section is turned ON while the pair of switching elements are turned OFF, whereby either of the pair of memory nodes is placed at a high potential while the other memory node is placed at a low potential.

Preferably, the non-volatile flip flop of the invention is designed such that the pair of non-volatile resistance change elements respectively have a ferroelectric substance and an MIS transistor whose gate electrode is connected to at least one end of the ferroelectric substance, and such that the polarization of the ferroelectric substances varies according to the potentials at the pair of memory nodes and the resistances of the MIS transistors vary according to the polarization.

Preferably, the non-volatile flip flop of the invention is designed such that, in each of the pair of non-volatile resistance change elements, the Vt value of the MIS transistor varies according to the polarization of the ferroelectric substance so that the resistance of the MIS transistor varies.

Preferably, the non-volatile flip flop of the invention is designed such that, in the store operation, according to the potentials of the pair of memory nodes, the Vt of the MIS transistor of either one of the pair of non-volatile resistance change elements is set to a high Vt value thereby bringing the MIS transistor of the one resistance change element into a high resistance state, while the Vt of the MIS transistor of the other non-volatile resistance change element is set to a low Vt value thereby bringing the MIS transistor of the other resistance change element into a low resistance state, and such that, in the recall operation, either of the pair of memory nodes is placed at a high potential while the other memory node is placed at a low potential, according to the difference in resistance between the MIS transistors of the pair of non-volatile resistance change elements.

Preferably, the non-volatile flip flop of the invention is designed such that, in the pair of non-volatile resistance change elements, a depletion layer of the MIS transistor varies in thickness according to the polarization of the ferroelectric substance, so that the resistance of the MIS transistor varies.

Preferably, the non-volatile flip flop of the invention is designed such that, in the store operation, according to the potentials of the pair of memory nodes, the depletion layer of the MIS transistor of either one of the pair of non-volatile resistance change elements increases in thickness thereby bringing the MIS transistor of the one resistance change element into the high resistance state, while the depletion layer of the MIS transistor of the other non-volatile resistance change element decreases in thickness thereby bringing the MIS transistor of the other resistance change element into the low resistance state, and such that, in the recall operation, either of the pair of memory nodes is placed at a high potential while the other memory node is placed at a low potential, according to the difference in resistance between the MIS transistors of the pair of non-volatile resistance change elements.

These objects as well as other objects, features and advantages of the invention will become apparent to those skilled in the art from the following description with reference to the accompanying drawings.

DESCRIPTION OF THE PREFERRED EMBODIMENTS

Referring now to the accompanying drawings, preferred embodiments of the invention will be hereinafter described in detail.

(First Embodiment)

Figure 1:
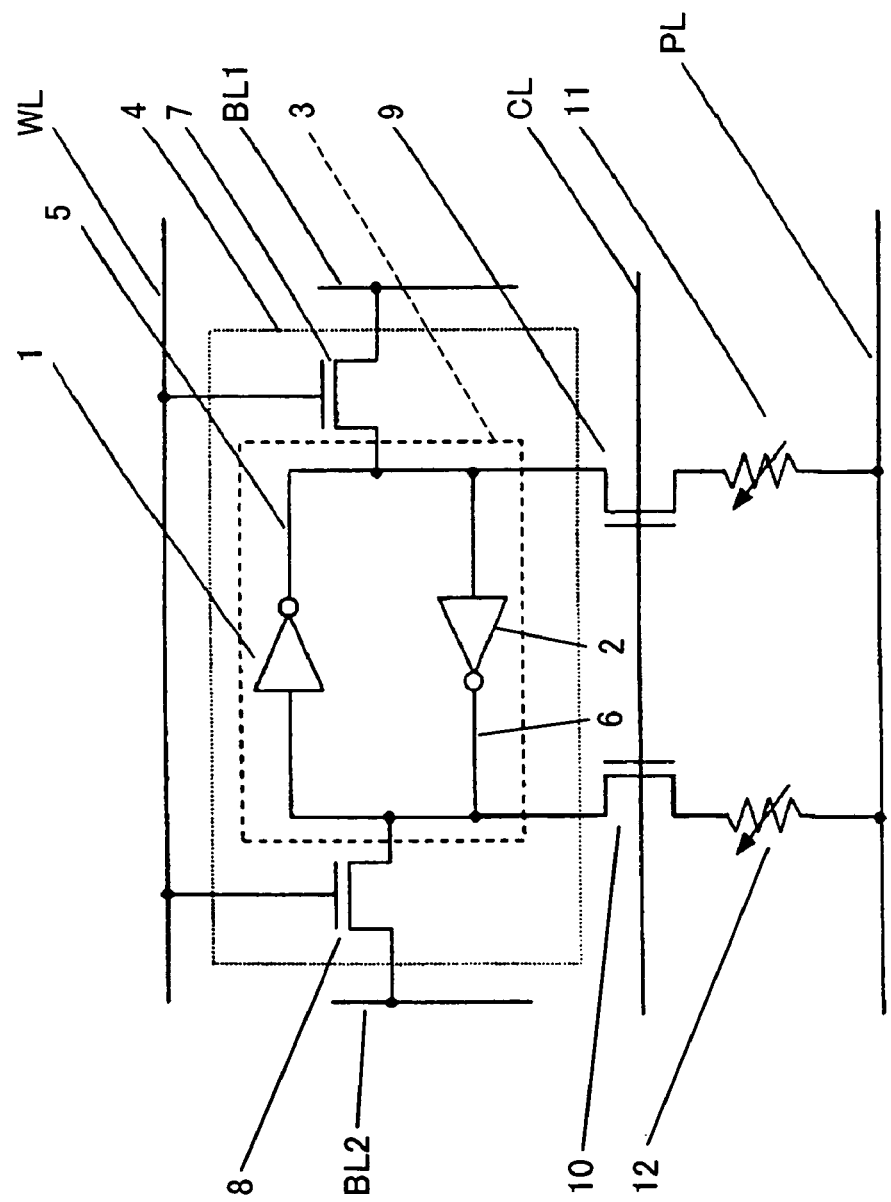
FIG. 1 is a circuit diagram showing a configuration of a non-volatile flip flop according to a first embodiment of the invention.

FIG. 1 is a circuit diagram showing a configuration of a non-volatile flip flop constructed according to a first embodiment of the invention.

(Configuration of Non-Volatile Flip Flop)

As shown in FIG. 1, a feedback circuit section 3 is constituted by a pair of inverters 1, 2 and the output and input of the inverter 1 are connected to the input and output of the inverter 2, respectively. A pair of nodes 5, 6 in the feedback circuit section 3 are connected to bit lines BL1, BL2 through switching transistors 7, 8, respectively. The gates of the switching transistors 7, 8 are connected to a common word line WL.

Resistance change elements 11, 12, which are connected at one end to a common plate line PL, are connected to the nodes 5, 6 through control transistors 9, 10 respectively. The gates of the control transistors 9, 10 are connected to a common control signal line CL.

Hereinafter, a section including the feedback circuit section 3 and the switching transistors 7, 8 is referred to as "flip flop section 4".

When the power source for the flip flop section 4 is turned ON, the potentials at the pair of nodes 5, 6 of the feedback circuit section 3 are maintained in a logic inversion state wherein one of the nodes 5, 6 is at power source potential whereas the other is at ground potential.

Although the control transistors 9, 10 are suspended from the nodes 5, 6, respectively, of the feedback circuit section 3 as shown in FIG. 1, the increase of the load imposed on the flip flop section 4 during normal operation is inconsiderable because the parasitic capacitance of the control transistors 9, 10 can be made small compared to that of the prior art ferroelectric capacitor described earlier. In addition, since the nodes 5, 6 are electrically separated from the plate line PL by the control transistors 9, 10, a leak current will not flow to the nodes 5, 6 through the plate line PL.

(Phase Change Material)

In this embodiment, a phase change material is used for the resistance change elements 10, 11. The characteristics of the phase change material will be hereinafter described.

The phase change material has different resistances when it is in an amorphous state and in a crystalline state and therefore the resistance of the phase change material can be varied by changing its phase. Such a phase change material is generally employed in optical disks and a typical example of it is Ge—Te—Sb based materials. The phase change material will be explained below, taking $Ge_2Sb_2Te_5$ for example.

In an optical disk, a laser beam is projected to the phase change material in the crystalline state thereby raising the temperature of the material to a melting point. Then, the phase change material is rapidly cooled and brought into the amorphous state, thereby recording data. Readout of the data is carried out by utilizing the difference in the reflection coefficient of light between the crystalline state and amorphous state of the phase change material.

While changes in the optical characteristic of the phase change material is thus utilized in the case of an optical disk, the non-volatile flip flop of this embodiment utilizes changes in the electrical feature of the phase change material. More specifically, the present embodiment makes use of such a feature that the phase change material has high resistance when it is in the amorphous state and low resistance when it is in the crystalline state.

Figure 5:
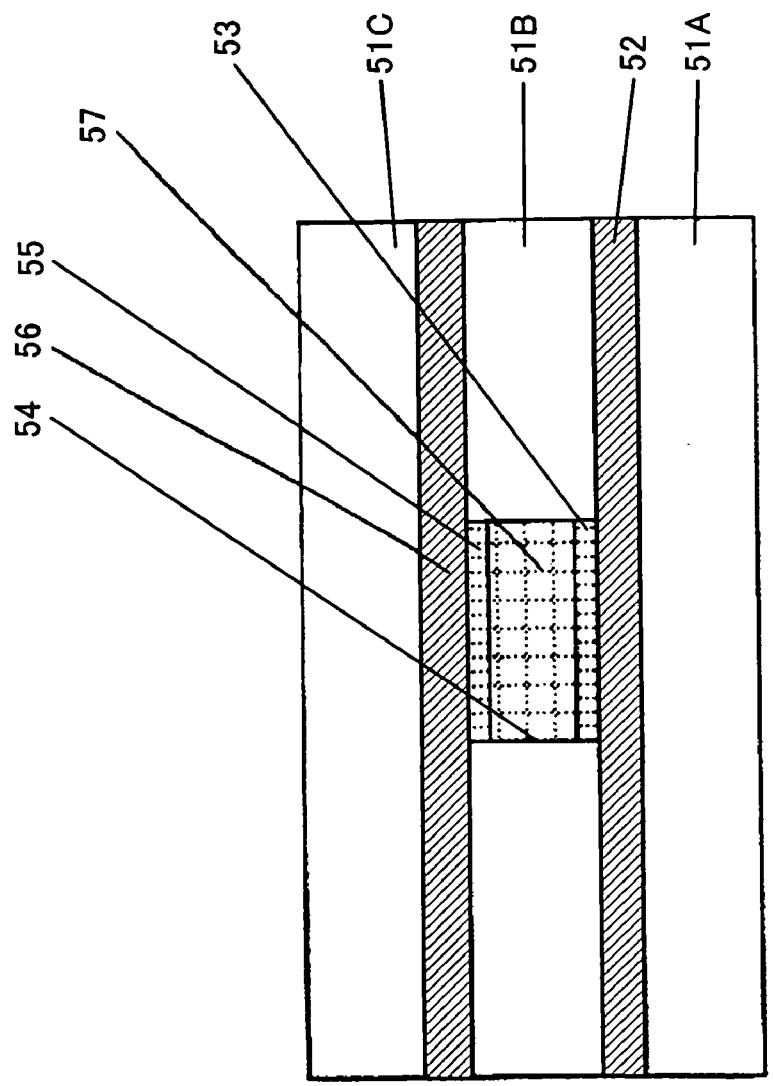
FIG. 5 is a sectional view diagrammatically showing a configuration of a wiring region around a semiconductor device incorporated in the non-volatile flip flop according to the first embodiment of the invention.

FIG. 5 is a sectional view which diagrammatically shows a configuration of a wiring region around a resistance change element incorporated in the non-volatile flip flop of the first embodiment of the invention.

On an interlayer film 51A located at the lower position, an Al wiring 52 and an interlayer film 51B are laminated in order, as shown in FIG. 5. Formed in this interlayer film 51B is a contact hole 54 within which a lower barrier metal layer 53, a phase change material 57 and an upper barrier metal layer 55 are laminated in order. On the interlayer film 51B, an upper wiring 56 and an interlayer film 51C are laminated in order. The lower barrier metal layer 53 is for preventing proliferation of Al and the phase change material 57 whereas the upper barrier metal layer 55 is for preventing proliferation of the material of the upper wiring 56 and the phase change material 57.

The wiring region having the above structure and positioned around the resistance change element is formed in the following procedure. First, an Al wiring 52 and a lower barrier metal layer 53 comprised of TiAlN are formed in order on the interlayer film 51A located at a lower position. After the interlayer film 51B has been formed on the lower barrier metal layer 53, the contact hole 54 is formed in the interlayer film 51B.

Next, the temperature of the substrate is set to room temperature and the $Ge_2Sb_2Te_5$ layer (phase change material) 57 is formed on the surface of the substrate by sputtering. Then, the $Ge_2Sb_2Te_5$ layer 57 outside the contact hole 54 is etched by etching or CMP (Chemical Mechanical Polishing). Thereafter, the upper barrier metal layer 55, the upper wiring 56 and the interlayer film 51C are formed in order on the $Ge_2Sb_2Te_5$ layer 57.

A notable point of each resistance change element consisting of the above-described phase change material is that crystallization of the $Ge_2Sb_2Te_5$ layer 57 is caused by Joule heat which is generated in the $Ge_2Sb_2Te_5$ layer 57 by injecting electric charges into the resistance change element and amorphization is caused by rapid cooling subsequent to melting.

Therefore, when a voltage pulse or current pulse having a large pulse width has been applied to the $Ge_2Sb_2Te_5$ layer 57 and its temperature has reached the melting point, rapid cooling attributable to subsequent pulse interruption brings the $Ge_2Sb_2Te_5$ layer 57 into the amorphous state. As a result, the $Ge_2Sb_2Te_5$ layer 57 exhibits high resistance. On the other hand, if a voltage pulse or current pulse having a small pulse width is applied to the $Ge_2Sb_2Te_5$ layer 57, its temperature reaches a crystallization point so that the $Ge_2Sb_2Te_5$ layer 57 comes into the crystalline state. As a result, the $Ge_2Sb_2Te_5$ layer 57 exhibits low resistance.

In this case, even if a voltage pulse or current pulse having a smaller pulse width or alternatively a voltage lower than or equal to a threshold is applied to the $Ge_2Sb_2Te_5$ layer 57, crystallization will not occur.

How much voltage is applied or how much current is supplied in order to cause the phase change of the phase change material depends on the heat conduction of the phase change material and on a rise in temperature caused by the voltage to be applied or the current to be supplied. If the voltage to be applied to the phase change material is power source voltage, the amorphous state can be established by melting and rapid cooling after application of a voltage pulse having a large pulse width, and the crystalline state can be established by applying a voltage pulse having a small pulse width. Also, the amorphous state or crystalline state can be established by making a potential difference. Accordingly, the membrane pressure and material composition ratio of the phase change material are controlled so as to cause a change in resistance appropriately to the operation, in compliance with the thermal design of the cell having the non-volatile flip flop of the present embodiment.

The $Ge_2Sb_2Te_5$ layer 57 has a specific resistance of about 100 $\Omega$cm in the amorphous state and a specific resistance of about 0.05 $\Omega$cm in the crystalline state. In the $Ge_2Sb_2Te_5$ layer 57, resistance therefore changes by two or three orders of magnitude between the high resistance state and the low resistance state.

(Operations of Non-Volatile Flip Flop)

Next, the operations of the non-volatile flip flop will be explained according to this embodiment.

(Normal Operations)

First, a data writing operation in the flip flop section 4 under normal operating conditions will be described. Suppose that a pair of inverse logic data elements are set in the pair of bit lines BL1 and BL2, respectively. In this case, if the word line WL is actuated to turn the switching transistors 7, 8 ON, the pair of inverse logic data elements are input to the feedback circuit section 3 and set in the nodes 5, 6 respectively. Herein, if the switching transistors 7, 8 are turned OFF, the pair of inverse logic data elements are kept in the nodes 5, 6 respectively. That is, either of the nodes 5, 6 has a high potential typified by power source potential while the other having a low potential typified by ground potential.

During such a data writing operation under normal operating conditions, the control transistors 9, 10 are brought into an OFF state by a signal (normally, ground potential) from the control signal line CL. Thus, the feedback circuit section 3 is separated from the pair of resistance change elements 11, 12 by the control transistors 9, 10. Therefore, the resistance change elements 11, 12 are not electrically affected.

Next, a data reading operation in the flip flop section 4 under normal operating conditions will be explained. With the operation described above, the pair of inverse logic data elements are kept in the nodes 5, 6, respectively, of the feedback circuit section 3. In this case, when the word line WL is actuated to turn the switching transistors 7, 8 ON after the bit lines BL1, BL2 have been set to ground potential, the pair of inverse logic data elements in the nodes 5, 6 of the feedback circuit section 3 are transmitted to the bit lines BL1, BL2, respectively. By sensing the potentials of the bit lines BL1, BL2 at this moment, readout of data can be carried out.

During the data reading operation of the flip flop section 4 under normal operating conditions, the feedback circuit section 3 is separated from the pair of resistance change elements 11, 12 by the control transistors 9, 10, similarly to the data writing operation. Therefore, the resistance change elements 11, 12 are not electrically affected.

Under normal operating conditions, the non-volatile flip flop of this embodiment performs the data writing operation and the data reading operation as described earlier, in the flip flop section 4. These writing/reading operations can be performed at high speed. Before the power source for the flip flop section 4 is turned OFF, a store operation is performed using the resistance change elements 11, 12. When the power source for the flip flop section 4 has been turned ON or prior to turning ON of the power source, a recall operation is likewise performed. Hereinafter, the store operation and the recall operation by use of these resistance change elements 11, 12 will be described in detail.

(Store Operation)

Figure 2:
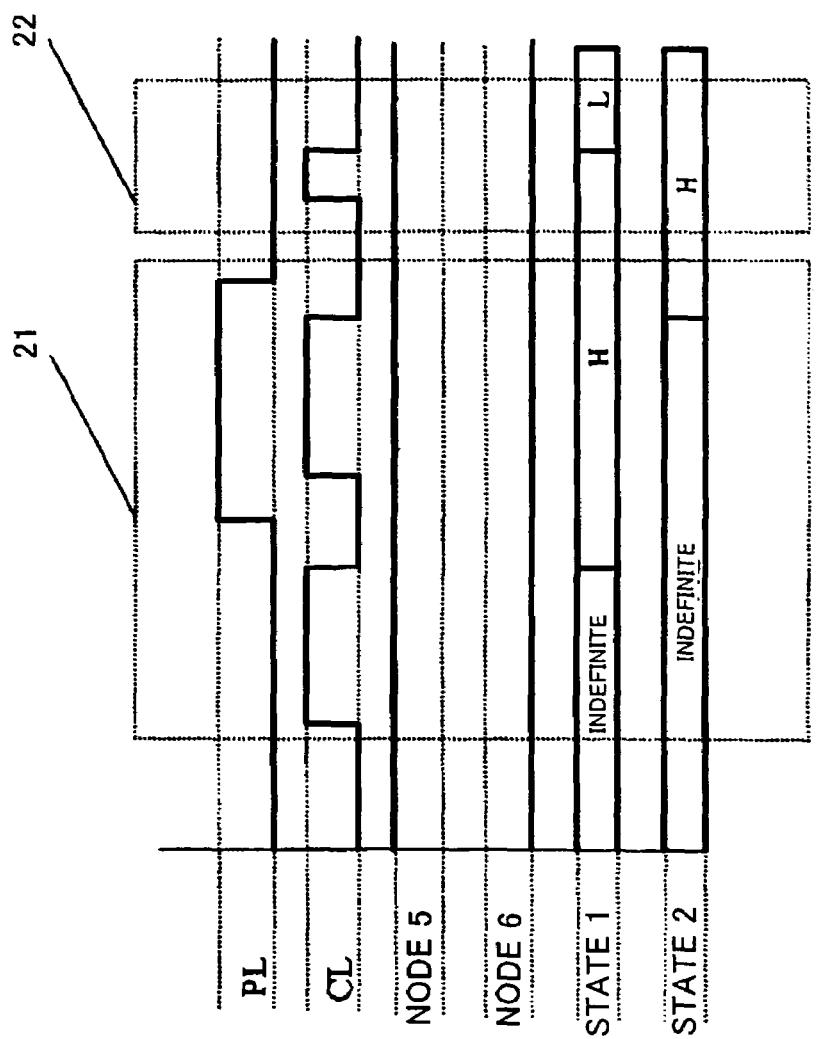
FIG. 2 is a timing chart showing one example of a store operation of the non-volatile flip flop according to the first embodiment of the invention.

The store operation by use of the resistance change elements 11, 12 of the non-volatile flip flop of the present embodiment is carried out in the following procedure. FIG. 2 is a timing chart showing one example of the store operation of the non-volatile flip flop according to the first embodiment of the invention. In FIG. 2, reference numerals 21, 22 denote a reset sequence and a writing sequence, respectively. Herein, the reset sequence means a procedure for bringing both of the resistance change elements 11, 12 into either the amorphous state (high resistance state) or the crystalline state (low resistance state). In FIG. 2, the states 1, 2 indicate that the resistance change elements 11, 12 are in the high resistance state (H), in the low resistance state (L) or in the indefinite state where it is indefinite whether the resistance change elements 11, 12 are in the high resistance state (H) or in the low resistance state (L).

The pair of inverse logic data elements are set in the nodes 5, 6 of the feedback circuit section 3, respectively. In the example shown in FIG. 2, the positive data (power source potential) is set in the node 5, whereas the negative data (ground potential) is set in the node 6. Here, the states of the resistance change elements 11, 12 are indefinite.

In the condition where the plate line PL is placed at ground potential, a signal having a pulse width of 100 ns is input to the control signal line CL and the pulse control transistors 9, 10 are kept in their ON state while the signal being input. By virtue of this, the power source voltage having a pulse width of 100 ns is applied to the resistance change element 11 connected to the node 5 in which the positive data is set. This causes the node 5 and the plate line PL, between which the resistance change element 11 is sandwiched, to be placed at power source potential and ground potential respectively, so that a potential difference is made in the resistance change element 11, and since the pulse width of the voltage applied to the resistance change element 11 is comparatively large, namely, 100 ns, the resistance change element 11 comes into the amorphous state (high resistance state).

Then, a signal having a pulse width of 100 ns is input to the control signal line CL with the plate line PL placed at power source potential, and the control transistors 9, 10 are kept in their ON state while the signal being input. With this arrangement, the power source voltage having a pulse width of 100 ns is applied to the resistance change element 12 to which the node 6 having the negative data set therein is connected. This causes the node 6 and the plate line PL, between which the resistance change element 12 is sandwiched, to be applied at ground potential and power source potential respectively, so that a potential difference is made in the resistance change element 11, and since the pulse width of the voltage applied to the resistance change element 11 is comparatively large, namely, 100 ns, the resistance change element 12 comes into the amorphous state (high resistance state).

By bringing both of the resistance change elements 11, 12 into the amorphous state in this way, the reset sequence 21 is completed. Although both of the resistance change elements 11, 12 are brought into the amorphous state in the reset sequence 21 of this embodiment, both of them may be brought into the crystalline state.

Then, a signal having a pulse width of 10 ns is input to the control signal line CL with the plate line PL returned to ground potential, and the control transistors 9, 10 are kept in their ON state while the signal being input. As a result, the power source voltage having a pulse width of 10 ns is applied to the resistance change element 11 which is connected to the node 5 having the positive data set therein. This causes the node 5 and the plate line PL, between which the resistance change element 11 is sandwiched, to be placed at power source potential and ground potential respectively, so that a potential difference is made in the resistance change element 11, and since the pulse width of the voltage applied to the resistance change element 11 is comparatively small, the resistance change element 11 comes into the crystalline state (low resistance state). On the other hand, no voltage is applied to the resistance change element 12 connected to the node 6 in which the negative data is set. The reason for this is that the node 6 and the plate line PL between which the resistance change element 12 is sandwiched are both placed at ground potential and therefore, no potential difference is caused in the resistance change element 12. As a result, the resistance change element 12 is kept in the amorphous state (high resistance state).

In this way, the resistance change element 11 comes into the low resistance state whereas the resistance change element 12 is kept in the high resistance state, whereby the writing sequence 22 is completed. The resistance states of the resistance change elements 11, 12 are retained after the power source is turned OFF. This is so-called "non-volatile".

(Modification of Store Operation)

The store operation using the resistance change elements of the non-volatile flip flow of the first embodiment may be carried out in the following way.

Figure 3:
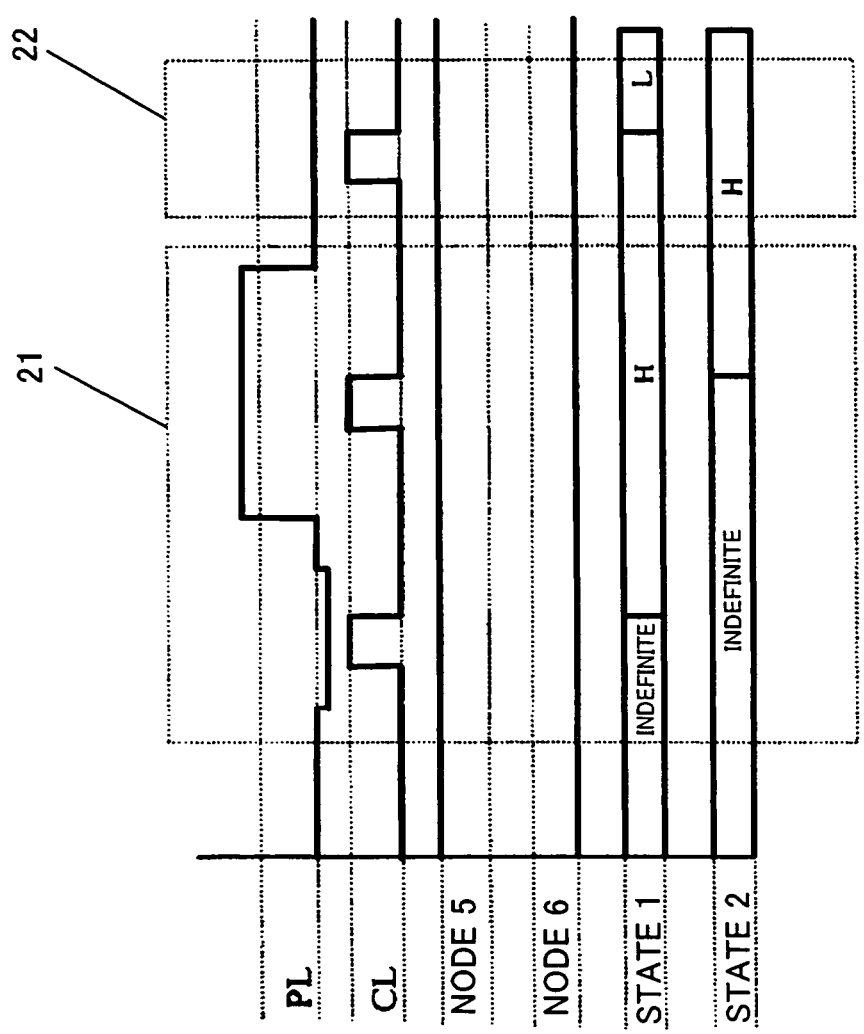
FIG. 3 is a timing chart showing a modification of the store operation of the non-volatile flip flop according to the first embodiment of the invention.

FIG. 3 is a timing chart showing a modification of the store operation of the non-volatile flip flow of the first embodiment of the invention. As shown in FIG. 3, while the plate line PL being placed at a potential lower than ground potential in the reset sequence 21 of this modification, a signal having a pulse width of 10 ns is fed to the control signal line CL thereby turning the control transistors 9, 10 ON. As described earlier, this causes application of the power source voltage having a pulse width of 10 ns to the resistance change element 11 which is connected to the node 5 having the positive data set therein. As a result, the resistance change element 11 comes into the amorphous state (high resistance state).

In the example shown in FIG. 2, the resistance change element 11 is brought into the amorphous state by applying the power source voltage having a pulse width of 100 ns to the resistance change element 11. In contrast with this, in the modification, the resistance change element 11 is brought into the amorphous state by applying the power source voltage having a pulse width of 10 ns to the resistance change element 11, on the ground that a voltage higher than the power source voltage can be applied to the resistance change element 11 by placing the plate line PL at a potential lower than ground potential.

Then, a signal having a pulse width of 10 ns is input to the control signal line CL with the plate line PL placed at a potential higher than power source potential, and the control transistors 9, 10 are kept in their ON state while the signal being input. As noted earlier, this allows the power source voltage having a pulse width of 10 ns to be applied to the resistance change element 12 connected to the node 6 having the negative data set therein. As a result, the resistance change element 11 is brought into the amorphous state (high resistance state).

In the example shown in FIG. 2, the resistance change element 12 is brought into the amorphous state by applying the power source voltage having a pulse width of 100 ns to the resistance change element 12. In contrast with this, in the modification, the resistance change element 12 is brought into the amorphous state by applying the power source voltage having a pulse width of 10 ns to the resistance change element 12, on the ground that a voltage higher than the power source voltage can be applied to the resistance change element 12 by placing the plate line PL at a potential higher than power source potential.

Thus, the reset sequence 21 is completed. The writing sequence 22 of the modification is the same as the writing sequence 22 of the example shown in FIG. 2. Specifically, a signal having a pulse width of 10 ns is fed to the control signal line CL to turn the control transistors 9, 10 ON with the plate line PL returned to ground potential, so that the voltage corresponding to the potential of the nodes 5, 6 and having a pulse width of 10 ns is applied to the resistance change elements 11, 12, respectively. With this, the power source voltage is applied to the resistance change element 11 connected to the node 5 having the positive data set therein so that the resistance change element 11 is brought into the crystalline state (low resistance state).

Accordingly, the pulse width of the signal fed to the control transistors 9, 10 is also 10 ns in the wiring sequence 22 of the modification. As a result, in the modification, the pulse width of the signal fed to the control transistors 9, 10 is 10 ns in both the reset sequence 21 and the writing sequence 22. That is, it is unnecessary to differentiate the pulse width of the signal fed to the control transistors 9, 10 in the reset sequence 21 from that of the writing sequence 22 like the example shown in FIG. 2. Therefore, the pulse width of the signal fed to the control transistors 9, 10 can be made constant in the modification so that there is no need to control the pulse width and, in consequence, this modification can be put into practice with a simple circuit.

How much the pulse width of the voltage to be applied to the resistance change elements 11, 12 should be in the above-described store operation is dependent on the electric charges necessary for causing a phase change in the resistance change elements 11, 12. Accordingly, the pulse width of the voltage to be applied to the resistance change elements 11, 12 is determined based on the potential difference between the nodes 5, 6 and the plate line and the electric charges required for causing a phase change in the resistance change elements 11, 12. In this respect, the same is applied to the recall operation to be described later.

The store operation described earlier with reference to FIGS. 2 and 3 is normally executed just before turning OFF of the power source of the flip flop section 4. By performing such a store operation while the flip flop section 4 being in normal operation, the power source can be turned OFF in units of blocks in the flip flop circuit constituted by a plurality of flip flop sections 4. Therefore, a reduction in the power consumption of the flip flop circuit can be realized.

(Recall Operation)

Figure 4:
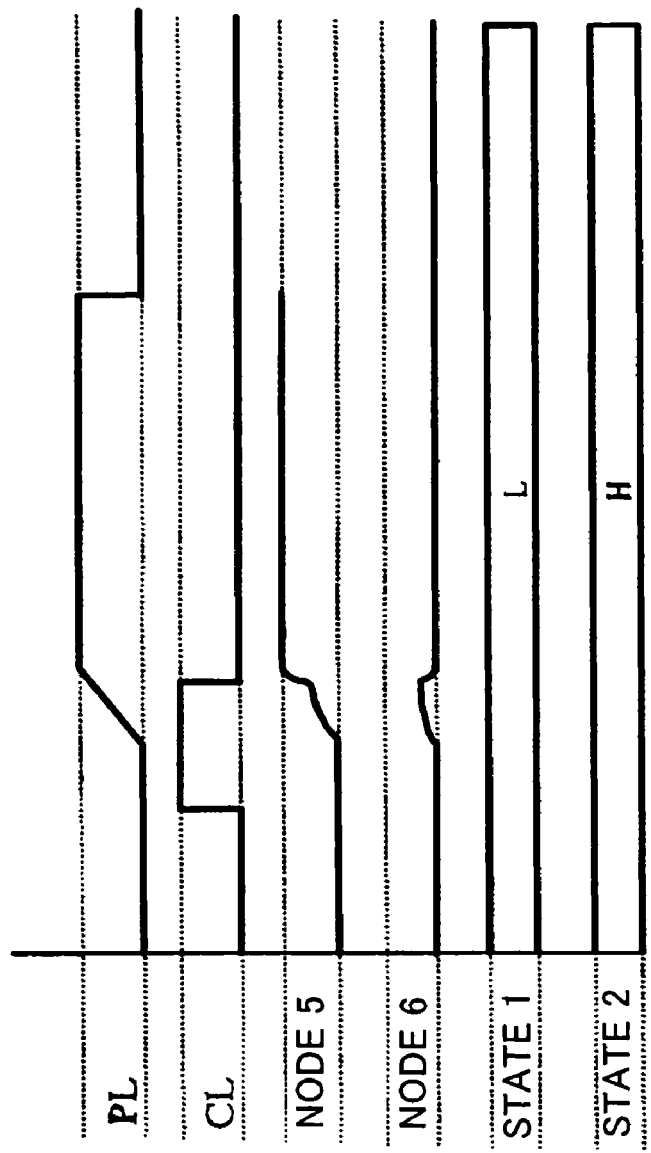
FIG. 4 is a timing chart showing one example of a recall operation of the non-volatile flip flop according to the first embodiment of the invention.

Next, a recall operation of the non-volatile flip flop of the present embodiment will be described. FIG. 4 is a timing chart showing one example of the recall operation of the non-volatile flip flop according to the first embodiment of the invention.

In the condition where the power source of the flip flop section 4 is turned OFF, either of the resistance change elements 11, 12 is in the amorphous state (high resistance state) whereas the other is in the crystalline state (low resistance state). In the example shown in FIG. 4, the resistance change element 11 is in the low resistance state whereas the resistance change element 12 is in the high resistance state.

Where the power source of the flip flop section 4 is turned OFF, the states of the node 5, 6 are indefinite. Therefore, a voltage having a smaller pulse width than that of the store operation is applied to the control transistors 9, 10 and the plate line PL is placed at ground potential. This causes the electric charges of the nodes 5, 6 to be released. If the power source of the flip flop section 4 is turned OFF for a long time, the potential of the nodes 5, 6 is substantially ground potential and therefore such an operation is unnecessary.

Next, the potential of the plate line PL is gradually increased with the control transistors 9, 10 kept in the ON state. When increasing the potential of the plate line PL in this way, the potential of the nodes 5, 6 rises. Since the resistances of the resistance change elements 11, 12 differ from each other by about two orders of magnitude, the potential of the node 5 connected to the resistance change element 11 which is in the low resistance state rises faster than the potential of the node 6 connected to the resistance change element 12 which is in the high resistance state. At that time, by turning the control transistors 9, 10 OFF at about the same time that the power source of the flip flop section 4 is turned ON, the data can be recalled at the nodes 5, 6. The reason why the data can be recalled at the nodes 5, 6 in this way is that when the power source of the flip flop section 4 is turned ON, even if the potential difference between the nodes 5, 6 is slight, either of the nodes is placed at ground potential whereas the other node is placed at power source potential, depending on the potential difference.

In this case, the control transistors 9, 10 are turned OFF before the potential of the plate line PL reaches power source potential, and therefore the recall operation is completed without a change in the states of the resistance change elements 11, 12.

If the time during which the potential of the plate line PL remains at power source potential is made shorter than the pulse width of the signal input to the control transistors 9, 10 in the above process, the recall operation can be carried out without writing data in the resistance change elements 11, 12. As a result, the re-store operation becomes unnecessary.

Also, the recall operation can be performed without writing data in the resistance change elements 11, 12 by increasing the potential of the plate line PL to a value lower than the power source voltage. In this case, the re-store operation is also unnecessary.

In the recall operation described above, the switching transistors 7, 8 and the control transistors 9, 10 are turned ON and then, the plate line PL is placed at ground potential. After the potential of the bit lines BL1, BL2 has been increased from ground potential to power source potential, the power source of the flip flop section 4 is turned ON. By performing such control, recall can be carried out using the data introduced from the bit lines BL1, BL2. Accordingly, it becomes possible to perform the recall operation in units of cells in a memory device having the same cells integrated therein and in a non-volatile logic.

As described above, the non-volatile flip flop of the present embodiment which uses a phase change material for the resistance change elements has the following advantages: the resistance change rate of the resistance change elements is two or more orders of magnitude; resistance can be easily changed by use of the pulses of a voltage or current; and simplified circuit configurations can be achieved since writing and reading of data can be carried out using the same terminal.

As noted earlier, under normal operating conditions, the store operation is performed before the power source of the flip flop section 4 is turned OFF, and when the power source has been turned ON or before the power source is turned ON, data is read out to the feedback circuit section 3 thereby performing the recall operation. Of course, it is possible to utilize the non-volatile flip flop of the invention for temporary data saving by performing the store operation and recall operation while the power source of the flip flop section 4 being in the ON state.

According to the present embodiment, since pulses are applied to the resistance change elements 11, 12 thereby changing the value of resistance, it is unnecessary to provide other special writing lines than the plate line PL so that the circuit can be simplified. In addition, a change in resistance by two or more orders of magnitude can be obtained in the resistance change elements 11, 12 made from a phase change material. Therefore, there is no need to sense subtle changes in capacitance unlike the case where the above-described conventional ferroelectric capacitor is used, so that the reliability of the store operation and the recall operation is improved.

Although the present embodiment has been particularly described with the switch transistors 7, 8 connected to the word line WL, an inverter gate openable/closable by actuation of the word line WL may be employed in place of the switching transistors 7, 8. Although the feedback circuit section 3 of the present embodiment is constituted by a pair of inverters 1, 2 composed of two transistors, the feedback circuit section may be constructed by connecting the resistors and the transistors between power source potential and ground potential.

(Second Embodiment)

The non-volatile flip flop of the first embodiment uses a phase change material for the resistance change elements. In contrast with this, the non-volatile flip flop of the second embodiment uses ferroelectric substances as the resistance change elements.

(Configuration of Non-Volatile Flip Flop)

Figure 6:
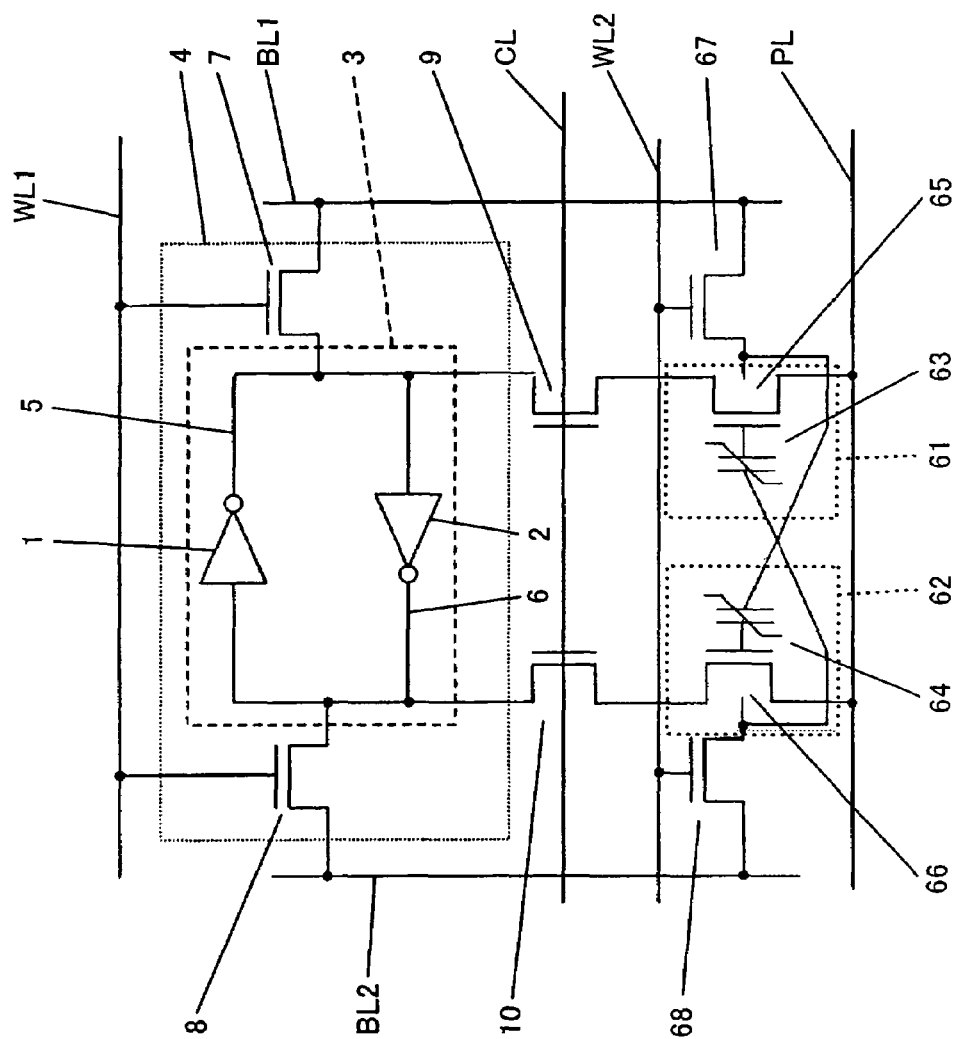
FIG. 6 is a circuit diagram showing a configuration of a non-volatile flip flop according to a second embodiment of the invention.

FIG. 6 is a circuit diagram showing a configuration of a non-volatile flip flop according to the second embodiment of the invention. As shown in FIG. 6, resistance change elements 61, 62 have ferroelectric substances 63, 64 and switching elements (MIS transistors) 65, 66. Each of the resistance change elements 61, 62 is a ferroelectric gate transistor in which the ferroelectric substance 63 (64) is used for a part of the gate oxidation film of the MIS transistor 65 (66) formed on a semiconductor substrate. Therefore, the resistance change element 61, 62 will be hereinafter referred to as "ferroelectric gate transistors 61, 62".

(Structure of Ferroelectric Gate Transistor)

Figure 7:
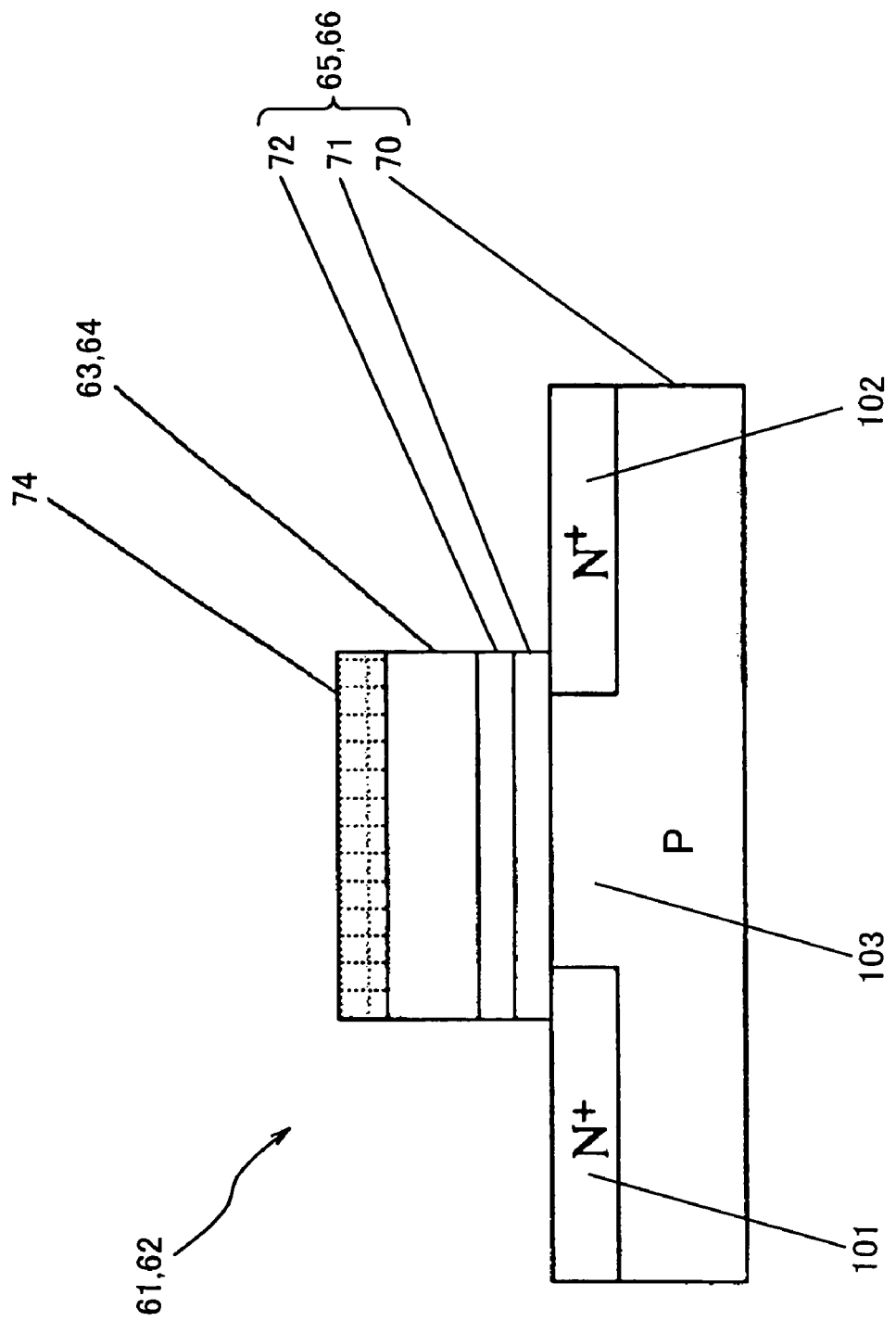
FIG. 7 is a sectional view diagrammatically showing a structure of a ferroelectric gate transistor provided for the non-volatile flip flop according to the second embodiment of the invention.

FIG. 7 is a sectional view diagrammatically showing a structure of a ferroelectric gate transistor provided for the non-volatile flip flop of the second embodiment of the invention. Referring to FIG. 7 in conjunction with FIG. 6, the ferroelectric gate transistor 61 of the non-volatile flip flop of the second embodiment has a source region and drain regions 101, 102 which are formed on the surface of a semiconductor substrate 70 made of silicon. On a channel region 103 between the source region and the drain regions 101, 102, an insulating film 71, a floating electrode 72, a ferroelectric substance 63 (64) and an upper electrode 74 are laminated in order. In the second embodiment, the ferroelectric gate transistors 61, 62 are an n-channel-type MIS transistor.

There are known several types of ferroelectric gate transistor structures. For example, the gate electrode (M)—ferroelectric substance (F)—semiconductor substrate (S) structure wherein a ferroelectric substance is directly formed on a semiconductor substrate such as a silicon substrate is called "MFS structure". The structure wherein an insulating film layer (I) is formed between a semiconductor substrate and a ferroelectric substance because of the difficulty of directly forming a ferroelectric substance on a semiconductor substrate is called "MFIS structure". Further, the structure having a floating electrode formed between a ferroelectric substance and an insulating film layer is called "MFMIS structure". The ferroelectric gate transistors provided for the non-volatile flip flop of the second embodiment are of the MFMIS structure.

As the ferroelectric substance 63, a bismuth-based material such as $SrBi_2Ta_2O_9$ or a Pb-based material such as PZT ($PbZrTiO_3$) may be used.

The ferroelectric substances 63, 64 of the ferroelectric gate transistors 61, 62 having such a structure are each connected, at one end thereof, to the gate section (the floating electrode 72) of the MIS transistor 65 (66) composed of the semiconductor substrate 70, the insulating film 71 and the floating electrode 72. The main terminal sections (the source region and the drain regions 101, 102) of the MIS transistors 65, 66 are connected to the common plate line PL and to the nodes 5, 6 respectively.

The other end of the ferroelectric substance 63 provided for the ferroelectric gate transistor 61 is connected to the bit line BL2 through the upper electrode 74 and the switching element 68 and to the semiconductor substrate 70 of the ferroelectric gate transistor 62 through the upper electrode 74. On the other hand, the other end of the ferroelectric substance 64 provided for the ferroelectric gate transistor 62 is connected to the bit line BL1 through the upper electrode 74 and the switching element 67 and to the semiconductor substrate 70 of the ferroelectric gate transistor 61 through the upper electrode 74.

The gate sections of the switching elements 67, 68 are connected to a second word line WL2 common to them.

Other components of the non-volatile flip flop of the second embodiment are the same as those of the first embodiment except that a first word line WL1 is employed in place of the word line WL, and therefore they are designated by the same reference numerals as in the first embodiment and an explanation of them will be omitted.

The ferroelectric gate transistors 61, 62 are each designed such that a voltage is applied between the upper electrode 74 and the semiconductor substrate 70 thereby to cause polarization of the ferroelectric substance 63 (64). The threshold value (Vt) for the MOS transistors is varied by electric charges induced in the insulating film 71 at that time. According to the change of the threshold value (Vt), the resistance value of the ferroelectric gate transistors 61 (62) varies and accordingly, the ferroelectric gate transistor 61 (62) functions as a resistance change element.

In the second embodiment, such a principle is utilized to store data. Specifically, by changing the voltage to be applied between the upper electrode 74 and the semiconductor substrate 70 from a forward direction to a reverse direction or vice versa, the polarization directions of the ferroelectric substances 63, 64 are varied. By use of the Vt value corresponding to the change, data 1 or 0 is stored.

In cases where the ferroelectric gate transistors 61, 62 are of the n-channel type as shown in FIG. 7, if a positive bias voltage is applied to the semiconductor substrate 70, there is the danger that the transistors 61, 62 are forward biased in the direction toward the channel and a current flows. Therefore, it becomes necessary to prevent the forward bias current, for instance, by placing the source region and the drain regions 101, 102 at floating potential.

It should be noted that another procedure may be employed in order to polarize the ferroelectric substances 63, 64. For example, the polarization directions of the ferroelectric substances 63, 64 may be changed by applying a positive or negative bias voltage to their respective upper electrodes 74 while the semiconductor substrates 70 being at ground potential.

(Normal Operations)

The operations of the non-volatile flip flop of the second embodiment will be hereinafter described.

The operations of the non-volatile flip flop under normal operating conditions of the second embodiment are the same as that of the first embodiment, and therefore an explanation of them is omitted herein. Under normal operating conditions, the switching elements 67, 68 are turned OFF. Therefore, the bit lines BL1, BL2 are electrically separated from the ferroelectric gate transistors 61, 62 respectively.

(Store Operation)

The store operation of the non-volatile flip flop of the second embodiment is performed in the following way. Referring to FIG. 6, before turning OFF of the power source of the flip flop section 4, the second word line WL2 is actuated to turn the switching elements 67, 68 ON. By setting a pair of inverse logic data elements in the bit lines BL1, BL2 beforehand, 1 or 0, that is, power source potential or ground potential is set in the upper electrodes 74 and semiconductor substrates 70 of the ferroelectric gate transistors 61, 62. As a result, the pair of ferroelectric substances 63, 64 are polarized such that their polarization directions are opposite to each other. The Vt value of the ferroelectric gate transistor 61 or 62 wherein a negative bias voltage has been applied to the semiconductor substrate 70 becomes high, whereas the Vt value of the ferroelectric gate transistor 61 or 62 wherein a positive bias voltage has been applied to the semiconductor substrate 70 becomes low. For the sake of illustration, it is supposed that the Vt value of the ferroelectric gate transistor 62 is high whereas the Vt value of the ferroelectric gate transistor 61 is low.

Thus, the store operation is completed. The polarization states of the ferroelectric substances 63, 64 of the resistance change elements 61, 62, which have been obtained by the store operation, are retained even after application of the bias voltage is stopped. Therefore, the following recall operation becomes possible.

(Recall Operation)

The recall operation of the non-volatile flip flop of the second embodiment is basically the same as that of the first embodiment and is performed by utilizing the difference in resistance between the ferroelectric gate transistors.

The first word line WL1 is actuated to turn the switching transistors 7, 8 ON, with the pair of bit lines BL1, BL2 being at ground potential. This causes the nodes 5, 6 of the feedback circuit section 3 to be placed at ground potential.

After the control signal line CL has been actuated to turn the control transistors 9, 10 ON, the potential of the plate line PL is gradually increased while the power source potential of the inverters 1, 2 of the feedback circuit section 3 being increased. At that time, the resistance change element 62 with a high Vt value comes into the high resistance state, whereas the resistance change element 61 with a low Vt value comes into the low resistance state. Therefore, like the first embodiment, the potential of the node 5 connected to the resistance change element 61 in the low resistance state rises rapidly, while the potential of the node 6 connected to the resistance change element 62 in the high resistance state rises slowly. At that time, the data can be recalled at the nodes 5, 6 by turning the control transistors 9, 10 OFF at substantially the same time that the power source of the flip flop section 4 is turned ON.

Although 0 bias voltage is applied to the upper electrodes 74 of the resistance change elements 61, 62 at that time, stable operation can be ensured by designing the resistance change elements 61, 62 such that the high or low resistance state can be maintained even when 0 bias voltage is applied.

(Modification 1 of the Second Embodiment)

Figure 8:
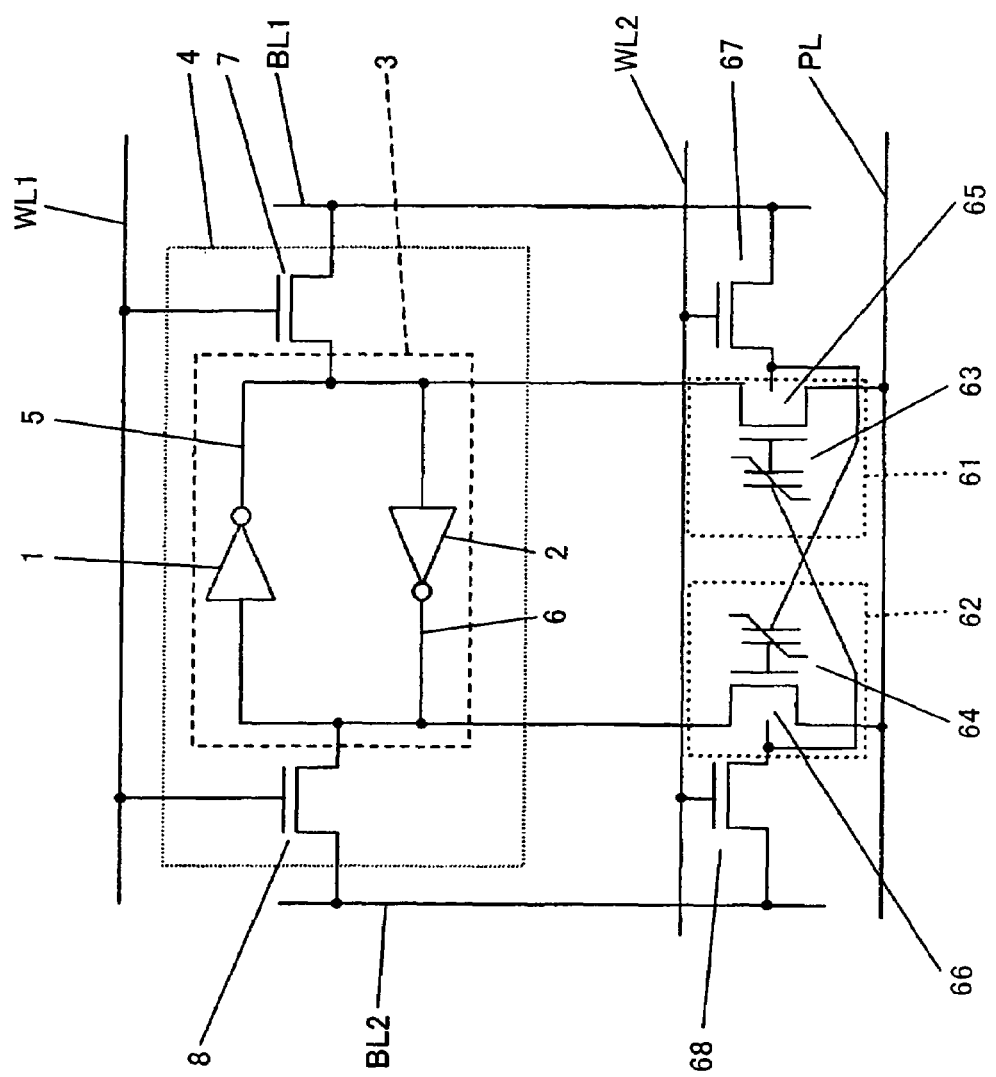
FIG. 8 is a circuit diagram showing another example of the configuration of the non-volatile flip flop according to the second embodiment of the invention.

The Vt values of the pair of resistance change elements 61, 62 are set high such that the switching elements 65, 66 are turned OFF where the bias voltage to be applied to the upper electrodes 74 is 0, whereby the need for the control signal line CL and the control transistors 9, 10 can be obviated (see FIG. 8).

As shown in FIG. 8, even if there are not provided a control signal line nor a control transistor, the ferroelectric gate transistors 61, 62 are in the OFF state during normal operation and therefore, the nodes 5, 6 are not electrically affected.

In this case, by turning the power source of the flip flop section 4 OFF to bring the flip flop section 4 into a high impedance state during the store operation and similarly bringing the plate line PL into a high impedance state, writing of data into the resistance change elements 61, 62 can be performed.

The Vt value is set such that the MIS transistors 65, 66 will be turned OFF if 0 bias voltage is applied during recalling. Therefore, a voltage higher than or equal to the Vt value is applied to the gate sections (floating electrodes 72) of both of the ferroelectric gate transistors 61, 62, or a voltage which turns the gate section of either of the ferroelectric gate transistors 61, 62 ON is applied to the gate sections of both transistors, thereby performing the recall operation.

Figure 9:
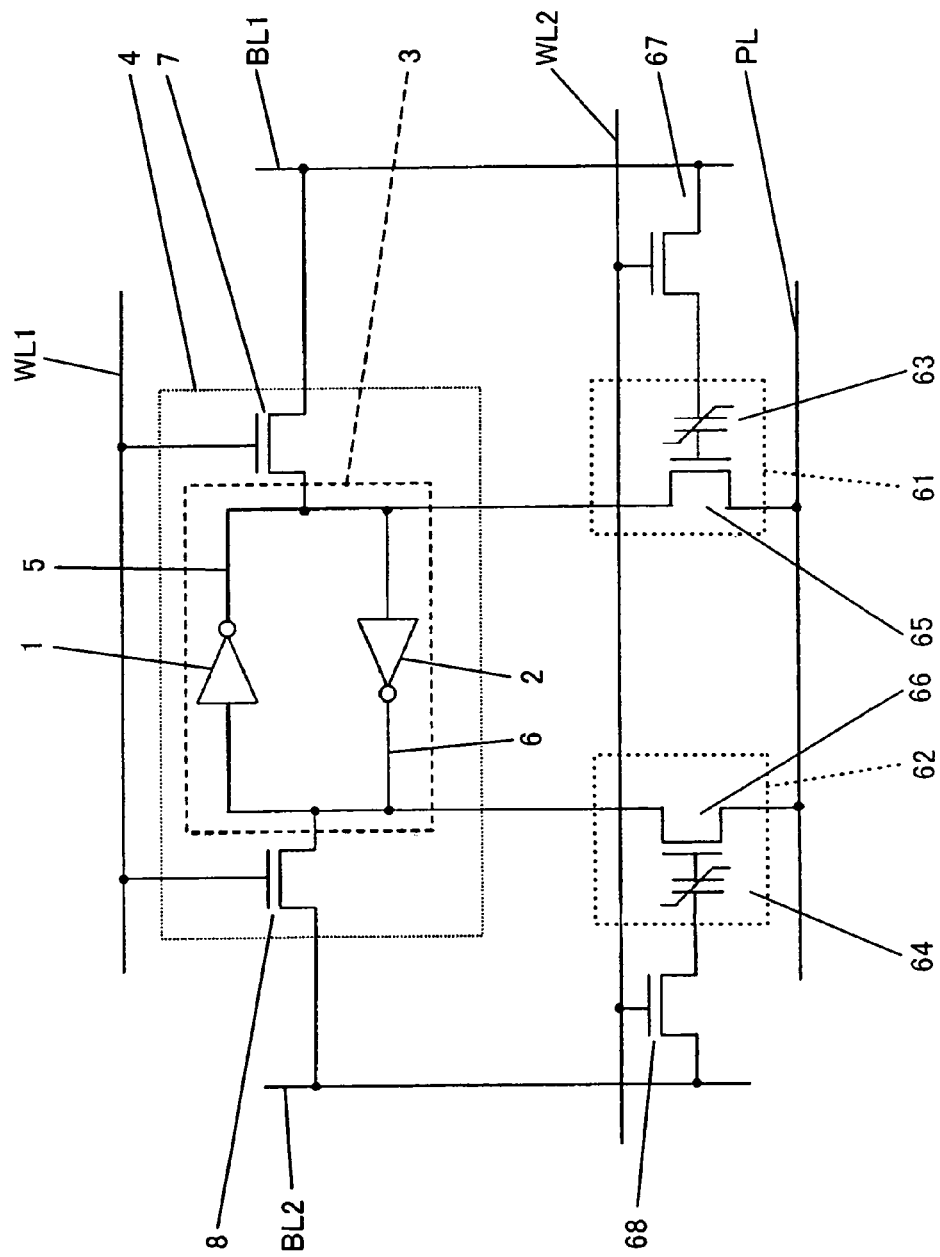
FIG. 9 is a circuit diagram showing still another example of the configuration of the non-volatile flip flop according to the second embodiment of the invention.

As another alternative, the configuration shown in FIG. 9 may be employed. In the configuration shown in FIG. 9, the ferroelectric substances 63, 64 of the ferroelectric gate transistors 61, 62 are connected, at one end thereof, to the gate sections of the MIS transistors 65, 66, respectively. The other end of each ferroelectric substance 63 (64) is connected to the bit line BL1 (BL2) through the upper electrode 74 and the switching element 67 (68). Other components are the same as those shown in FIG. 6.

(Modification 2 of the Second Embodiment)

Figure 10:
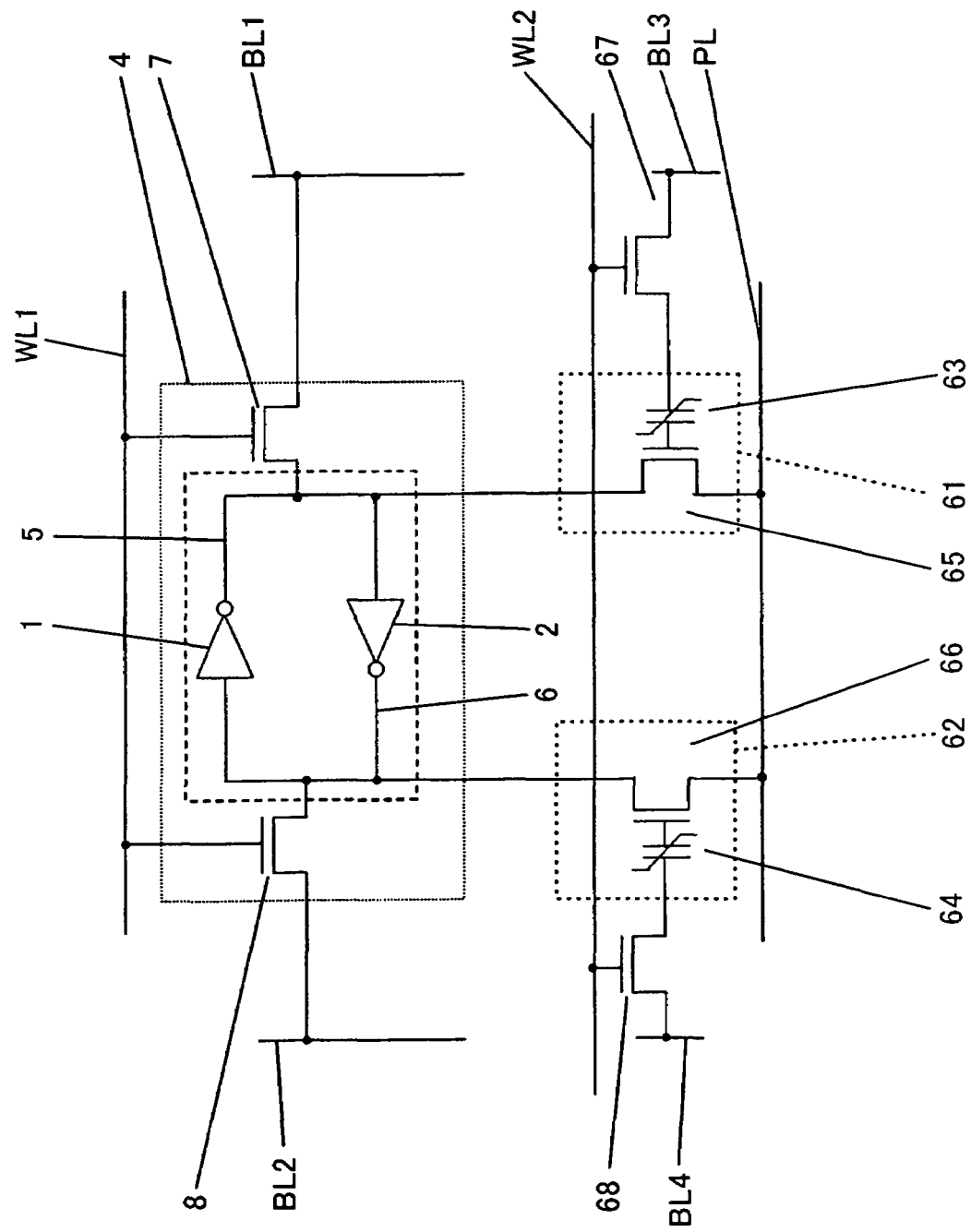
FIG. 10 is a circuit diagram showing still another example of the configuration of the non-volatile flip flop according to the second embodiment of the invention.

As another alternative, the configuration shown in FIG. 10 may be employed. In the configuration shown in FIG. 10, bit lines BL3, BL4 are provided in addition to the bit lines BL1, BL2. The other end of each ferroelectric substance 63 (64) is connected to the bit line BL3 (BL4) through the upper electrode 74 and the switching element 67 (68). Other components are the same as those shown in FIG. 9.

Referring to the configurations shown in FIGS. 9 and 10, when performing writing between the semiconductor substrates and the upper electrodes of the ferroelectric gate transistors, the semiconductor substrates are constantly maintained at ground potential, and the voltages to be applied to the upper electrodes are placed at plus and minus potentials. For setting the potentials of the upper electrodes to plus and minus values, the potential of the bit lines BL1, BL2 differs from the voltage written in the flip flop section 4. Therefore, another data writing operation becomes necessary in addition to the normal operation for writing data into the flip flop section 4. Where the bit lines BL3, BL4 are additionally provided as shown in FIG. 10, writing into the ferroelectric gate transistors can be performed separately from the operation of the flip flop section 4.

(Third Embodiment)

A non-volatile flip flop constructed according to a third embodiment uses ferroelectric gate transistors as the non-volatile resistance change elements similarly to the second embodiment. The third embodiment differs from the second embodiment in that the resistance of the semiconductor layer is varied by changing the thickness of the depletion layer of the semiconductor layer through the polarization of the ferroelectric substance formed on the semiconductor layer.

(Configuration of Non-Volatile Flip Flop)

The overall configuration of the non-volatile flip flop of the third embodiment is the same as that of the first embodiment which has been described earlier with reference to FIG. 6 and therefore its explanation is omitted.

(Structure of Ferroelectric Gate Transistor)

Figure 11:
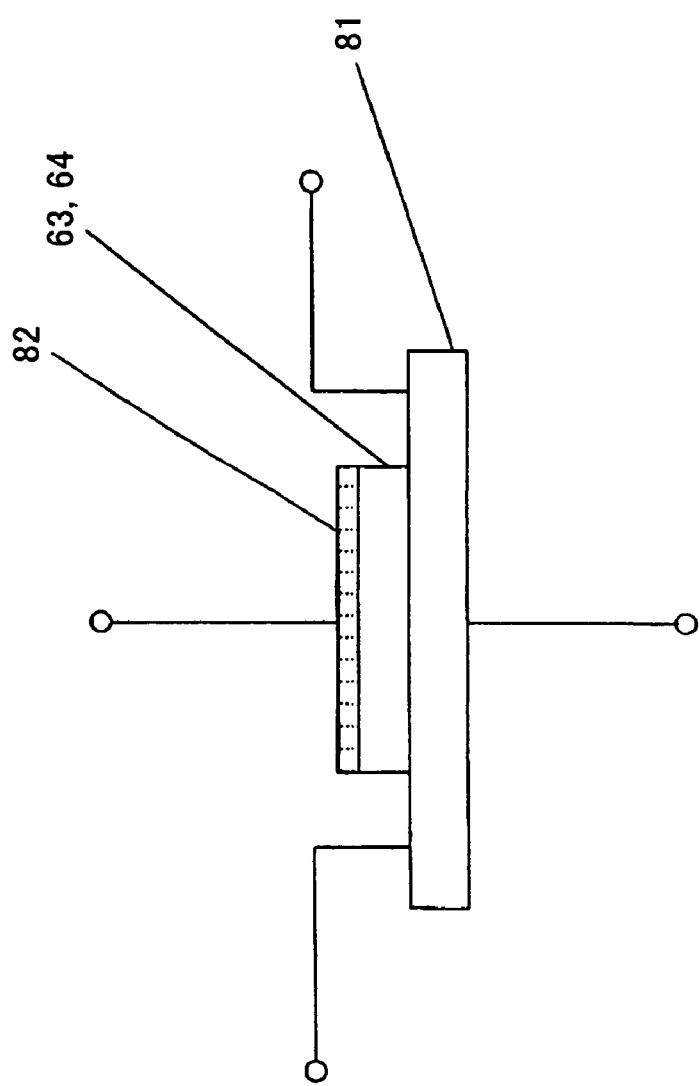
FIG. 11 is a sectional view diagrammatically showing a structure of a ferroelectric gate transistor provided for a non-volatile flip flop according to a third embodiment of the invention.

FIG. 11 is a sectional view diagrammatically showing a structure of a ferroelectric gate transistor provided for a non-volatile flip flop of the third embodiment of the invention. Referring to FIG. 11 in conjunction with FIG. 6, the resistance change element 61 provided for the non-volatile flip flop of the third embodiment is designed such that the ferroelectric substance 63 and an upper electrode 82 are laminated in order on a semiconductor layer 81 made from silicon. It should be noted that an insulating layer may be provided between the ferroelectric substance 63 and the semiconductor layer 81 similarly to the first embodiment.

In the resistance change element 61 having the above structure, when a voltage is applied between the upper electrode 82 and the semiconductor layer 81 thereby reversing the polarization of the ferroelectric substance 63, the thickness of the depletion layer of the semiconductor layer 81 varies. At that time, the resistance value in an in-plane direction of the semiconductor layer 81 changes by the amount equivalent to the change in the thickness of the depletion layer. Since the resistance value of the ferroelectric gate transistor changes according to the change in the thickness of the depletion layer, the ferroelectric gate transistor functions as the resistance change element.

In the third embodiment, the principle described above is utilized for storing data. Specifically, the polarization direction of the ferroelectric substance 63 can be varied by changing the voltage to be applied between the upper electrode 82 and the semiconductor layer 81 forwardly or reversely. Then, data 1 or 0 is stored according to the thickness of the depletion layer which changes according to the change in the direction of polarization.

Since the third embodiment only utilizes the thickness of the depletion layer of the semiconductor layer 81, unlike the case where a transistor is formed on an ordinary silicon substrate, a range of choice for the material of the semiconductor layer 81 is widened. The semiconductor layer 81 may be formed from, for instance, an oxide semiconductor such as AlN, ZnO and InO$_2$, besides silicon.

The operations of the non-volatile flip flop of the third embodiment will be described below.

The operations carried out under normal operating conditions are the same as in the first embodiment and therefore an explanation of them is omitted.

(Store Operation)

Figure 12:
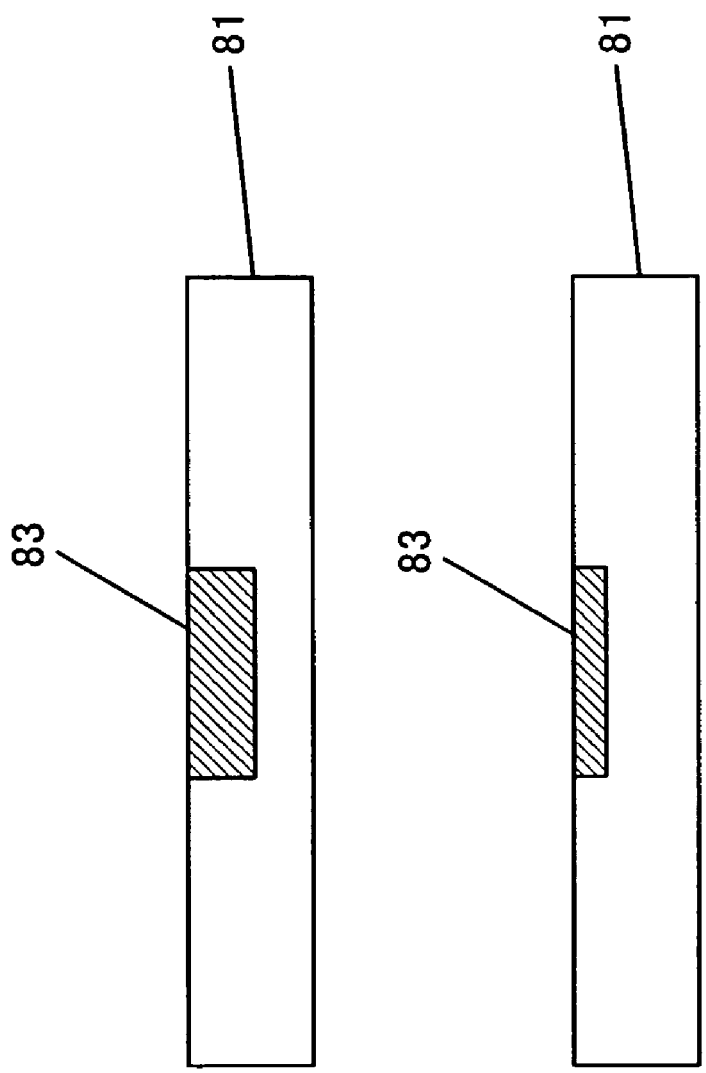
FIGS. 12A and 12B are sectional views conceptually showing changes in the thickness of a depletion layer of a semiconductor substrate of the ferroelectric gate transistor provided for the non-volatile flip flop according to the third embodiment of the invention.
Figure 13:
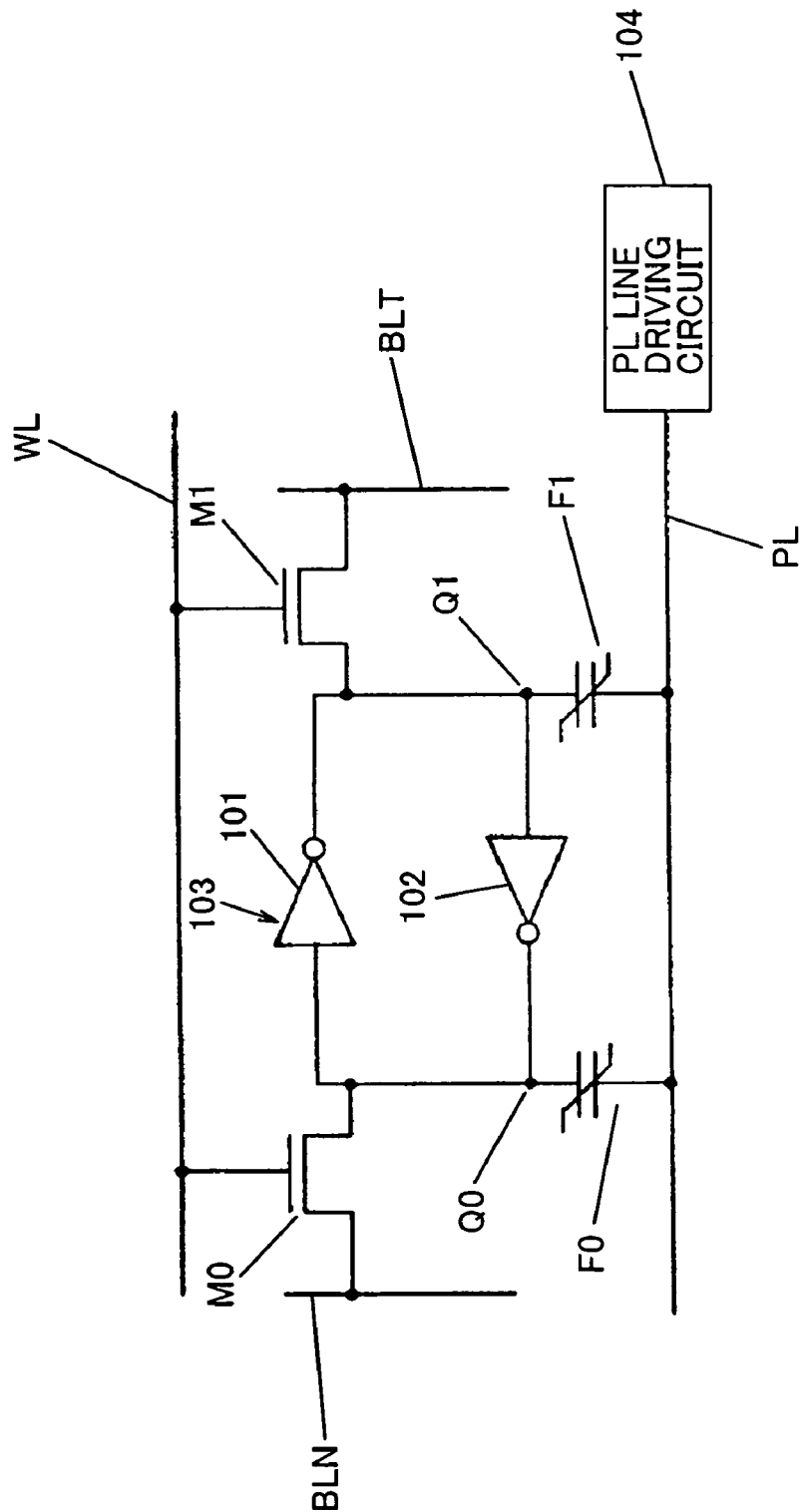
FIG. 13 is a circuit diagram showing a configuration of a prior art non-volatile memory.

The store operation of the non-volatile flip flop of the third embodiment is performed in the following way. Like the second embodiment, the polarization directions of the pair of ferroelectric substances 63, 64 can be set oppositely to each other by setting 1 or 0, that is, power source potential or ground potential in the upper electrodes 82 or semiconductor layers 81 of the resistance change elements 61, 62. In this case, the thickness of the depletion layer 83 of the semiconductor layer 81 increases in the resistance change element 61 or 62 in which a positive bias voltage has been applied to the upper electrode 82 (see FIG. 12A). On the other hand, in the resistance change element 61 or 62 in which a positive bias voltage has been applied to the semiconductor substrate 81, the thickness of the depletion layer 83 of the semiconductor layer 81 decreases (see FIG. 12B). In the following explanation, it is supposed for the sake of simplicity that the thickness of the depletion layer 83 of the semiconductor layer 81 in the resistance change element 62 is great, whereas the thickness of the depletion layer 83 of the semiconductor layer 81 in the resistance change element 61 is insignificant.

In this way, the store operation is completed.

(Recall Operation)

Next, the recall operation of the non-volatile flip flop of the third embodiment will be described.

Similarly to the second embodiment, after each node 5 (6) of the feedback circuit section 3 has been placed at ground potential, the control transistors 9, 10 are turned ON and the potential of the plate line PL is gradually increased while the power source potential of the inverters 1, 2 of the feedback circuit section 3 being increased. At that time, the resistance change element 62 having the semiconductor layer 81 with the thick depletion layer 83 comes into the high resistance state, whereas the resistance change element 61 having the semiconductor layer 81 with the thin depletion layer 83 comes into the low resistance state. Therefore, the potential of the node 5 connected to the resistance change element 61 in the low resistance state rises rapidly, whereas the potential of the node 6 connected to the resistance change element 62 in the high resistance state rises slowly, like the first embodiment. At that time, by turning the control transistors 9, 10 OFF at about the same time that the power source of the flip flop section 4 is turned ON, the data can be recalled at the nodes 5, 6.

In the ferroelectric gate transistors of the second embodiment, the source and drains are the terminals for reading data. On the other hand, in the ferroelectric gate transistors of the third embodiment, the two points at which the change in the resistance value in an in-plane direction of the semiconductor layer can be detected are the terminals for data reading data. In all of the foregoing embodiments, the upper electrodes and the semiconductor substrates are the terminals for writing data, since the polarization of each ferroelectric substance is reversed through application of a voltage between the upper electrode and the semiconductor substrate, thereby performing data writing.

More specifically, the resistance change elements of the second and third embodiments should be four-terminal elements having two terminals for data writing and another two terminals for data reading. Therefore, resistance change elements are applicable to the invention as far as they are such four-terminal elements.

(Others)

In cases where the non-volatile flip flop of any of the foregoing embodiments is applied to a multiplexer or a filed programmable device having a look up table, program data can be reproduced at high speed and stored in the resistance change elements during the normal operations of the flip flop section.

In addition, data such as part of the logic data being currently processed can be kept in the vicinity of the flip flop section, by using the flip flop most commonly used for logic devices as the non-volatile flip flop in each embodiment of the invention. This not only obviates the need for an external memory but also enables high speed processing. Since it becomes possible to frequently turn the power source OFF by small circuit scale units (e.g., by units of circuit blocks), taking the advantage of the non-volatile characteristics, power consumption can be reduced. Further, since the flip flop performs non-volatile operation, data stored in shift registers or the like modeled on a flip flop can be retained. Generally, data is shifted using a clock at that time. Where the non-volatile flip flop of any embodiment of the invention is applied to a device, non-volatile operation becomes possible, so that the device is advantageously applicable to asynchronous circuits or the like.

Additionally, the non-volatile flip flop of any of the embodiments of the invention is disposed at the intersections of a plurality of bit lines and a plurality of word lines in the form of a matrix, whereby a semiconductor memory device having two modes can be attained, which performs data writing/reading at a speed equivalent to that of SRAM under normal operating conditions and performs non-volatile operation when the power source of the flip flop section is turned OFF.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function maybe varied substantially without departing from the spirit of the invention and all modifications which come within the scope of the appended claims are reserved.

INDUSTRIAL APPLICABILITY

The non-volatile flip flop according to the Invention is useful as a non-volatile memory adapted for use in a mobile terminal.

The invention claimed is:

1. A non-volatile flip flop comprising:
a flip flop section having a pair of memory nodes for storing a pair of inverse logic data elements; and
a pair of non-volatile resistance change elements which are connected to the pair of memory nodes respectively and the resistances of which vary so as to be retainable;
wherein, in a store operation, the resistances of the pair of non-volatile resistance change elements can be varied according to the respective potentials of the pair of memory nodes and, in a recall operation, the pair of memory nodes can be placed at potentials respectively according to the difference in resistance between the pair of non-volatile resistance change elements.

2. The non-volatile flip flop according to claim 1,
wherein, in the store operation, either of the pair of non-volatile resistance change elements is brought into a high resistance state whereas the other is brought into a low resistance state according to the respective potentials of the pair of memory nodes; and
wherein, in the recall operation, either of the pair of memory nodes is placed at a high potential whereas the other is placed at a low potential according to the difference in resistance between the pair of non-volatile resistance change elements.

3. The non-volatile flip flop according to claim 2,
wherein the pair of non-volatile resistance change elements are made from a phase change material which is in a high resistance state when it is in an amorphous state and is in a low resistance state when it is in a crystalline state.

4. The non-volatile flip flop according to claim 3,
wherein, in the store operation, either of the pair of non-volatile resistance change elements is in the amorphous state while the other being in the crystalline state.

5. The non-volatile flip flop according to claim 4,
wherein a pair of switching elements are sandwiched between the pair of memory nodes and the pair of non-volatile resistance change elements;
wherein the pair of non-volatile resistance change elements are connected to a plate line;
wherein either of the pair of memory nodes is at a high potential while the other being at a low potential; and
wherein by turning the pair of switching elements ON to cause a potential difference between the pair of memory nodes and the plate line, either of the pair of non-volatile resistance change elements is brought into the amorphous state and the other is brought into the crystalline state.

6. The non-volatile flip flop according to claim 5,
wherein after both of the pair of non-volatile resistance change elements are brought into the amorphous state by causing a potential difference between the pair of memory nodes and the plate line, the state of either of the pair of non-volatile resistance change elements is changed to the crystalline state, whereby either of the pair of non-volatile resistance change elements is brought into the amorphous state while the other is brought into the crystalline state.

7. The non-volatile flip flop according to claim 6,
wherein a potential difference is produced between both ends of the other non-volatile resistance change element sandwiched between the other memory node maintained at a low potential and the plate line by applying a high potential voltage to the plate line, while the other non-volatile resistance change element is brought into the amorphous state by applying a voltage having a high pulse width to the other non-volatile resistance change element; and
a potential difference is produced between both ends of the one non-volatile resistance change element sandwiched between the one memory node maintained at a high potential and the plate line by applying a low potential voltage to the plate line, while the one non-volatile resistance change element is brought into the amorphous state by applying a voltage having a high pulse width to the one non-volatile resistance change element;
whereby the pair of non-volatile resistance change elements are both brought into the amorphous state.

8. The non-volatile flip flop according to claim 6,
wherein a potential difference is produced between both ends of the one non-volatile resistance change element sandwiched between the one memory node maintained at a high potential and the plate line by applying a low potential voltage to the plate line, while the one non-volatile resistance change element is brought into the amorphous state by applying a voltage having a high pulse width to the one non-volatile resistance change element; and a potential difference is produced between both ends of the other non-volatile resistance change element sandwiched between the other memory node maintained at a low potential and the plate line by applying a high potential voltage to the plate line, while the other non-volatile resistance change element is brought into the amorphous state by applying a voltage having a high pulse width to the other non-volatile resistance change element;

whereby the pair of non-volatile resistance change elements are both brought into the amorphous state.

9. The non-volatile flip flop according to claim 6, wherein a potential difference is produced between both ends of the one of the pair of non-volatile resistance change elements both of which are in the amorphous state, by applying a low potential voltage to the plate line, the one element being sandwiched between the one memory node maintained at a high potential and the plate line, while the one non-volatile resistance change element is brought into the crystalline state by applying a voltage having a low pulse width to the one non-volatile resistance change element, whereby the state of either of the pair of non-volatile resistance change elements is changed to the crystalline state.

10. The non-volatile flip flop according to claim 6, wherein a potential difference is produced between both ends of the other one of the pair of non-volatile resistance change elements both of which are in the amorphous state, by applying a high potential voltage to the plate line, the other element being sandwiched between the other memory node maintained at a low potential and the plate line, while the other non-volatile resistance change element is brought into the crystalline state by applying a voltage having a low pulse width to the other non-volatile resistance change element, whereby the state of either of the pair of non-volatile resistance change elements is changed to the crystalline state.

11. The non-volatile flip flop according to claim 5, wherein after both of the non-volatile resistance change elements are brought into the crystalline state by producing a potential difference between the pair of memory nodes and the plate line, the state of either of the pair of non-volatile resistance change elements is changed to the amorphous state, whereby either of the pair of non-volatile resistance change elements is brought into the amorphous state while the other element is brought into the crystalline state.

12. The non-volatile flip flop according to claim 11, wherein a potential difference is produced between both ends of the other non-volatile resistance change element sandwiched between the other memory node maintained at a low potential and the plate line by applying a high potential voltage to the plate line, while the other non-volatile resistance change element is brought into the crystalline state by applying a voltage having a low pulse width to the other non-volatile resistance change element; and a potential difference is produced between both ends of the one non-volatile resistance change element sandwiched between the one memory node maintained at a high potential and the plate line by applying a low potential voltage to the plate line, while the one non-volatile resistance change element is brought into the crystalline state by applying a voltage having a low pulse width to the one non-volatile resistance change element;

whereby the pair of non-volatile resistance change elements are both brought into the crystalline state.

13. The non-volatile flip flop according to claim 11, wherein a potential difference is produced between both ends of the one non-volatile resistance change element sandwiched between the one memory node maintained at a high potential and the plate line by applying a low potential voltage to the plate line, while the one non-volatile resistance change element is brought into the crystalline state by applying a voltage having a low pulse width to the one non-volatile resistance change element; and a potential difference is produced between both ends of the other non-volatile resistance change element sandwiched between the other memory node maintained at a low potential and the plate line by applying a high potential voltage to the plate line, while the other non-volatile resistance change element is brought into the crystalline state by applying a voltage having a low pulse width to the other non-volatile resistance change element;

whereby the pair of non-volatile resistance change elements are both brought into the crystalline state.

14. The non-volatile flip flop according to claim 11, wherein a potential difference is produced between both ends of the one of the pair of non-volatile resistance change elements both of which are in the crystalline state, by applying a low potential voltage to the plate line, the one element being sandwiched between the one memory node maintained at a high potential and the plate line, while the one non-volatile resistance change element is brought into the amorphous state by applying a voltage having a high pulse width to the one non-volatile resistance change element, whereby the state of either of the pair of non-volatile resistance change elements is changed to the amorphous state.

15. The non-volatile flip flop according to claim 11, wherein a potential difference is produced between both ends of the other one of the pair of non-volatile resistance change elements both of which are in the crystalline state, by applying a high potential voltage to the plate line, the other element being sandwiched between the other memory node maintained at a low potential and the plate line, while the other non-volatile resistance change element is brought into the amorphous state by applying a voltage having a high pulse width to the other non-volatile resistance change element, whereby the state of either of the pair of non-volatile resistance change elements is changed to the amorphous state.

16. The non-volatile flip flop according to claim 5, wherein, in the recall operation, the pair of switching elements are turned ON, the potential at the plate line is raised from ground potential to power source potential, and a power source for the flip flop section is turned ON while the pair of switching elements are turned OFF, whereby either of the pair of memory nodes is placed at a high potential while the other memory node is placed at a low potential.

17. The non-volatile flip flop according to claim 1, wherein the pair of non-volatile resistance change elements respectively have a ferroelectric substance and an MIS transistor whose gate electrode is connected to at least one end of the ferroelectric substance; and wherein the polarization of the ferroelectric substances varies according to the potentials at the pair of memory nodes and the resistances of the MIS transistors vary according to the polarization.

18. The non-volatile flip flop according to claim 17, wherein in each of the pair of non-volatile resistance change elements, the Vt value of the MIS transistor varies according to the polarization of the ferroelectric substance so that the resistance of the MIS transistor varies.

19. The non-volatile flip flop according to claim 18,
wherein, in the store operation, according to the potentials of the pair of memory nodes, the Vt of the MIS transistor of either one of the pair of non-volatile resistance change elements is set to a high Vt value thereby bringing the MIS transistor of the one resistance change element into a high resistance state, while the Vt of the MIS transistor of the other non-volatile resistance change element is set to a low Vt value thereby bringing the MIS transistor of the other resistance change element into a low resistance state; and
wherein, in the recall operation, either of the pair of memory nodes is placed at a high potential while the other memory node is placed at a low potential, according to the difference in resistance between the MIS transistors of the pair of non-volatile resistance change elements.

20. The non-volatile flip flop according to claim 17,
wherein, in the pair of non-volatile resistance change elements, a depletion layer of the MIS transistor varies in thickness according to the polarization of the ferroelectric substance, so that the resistance of the MIS transistor varies.

21. The non-volatile flip flop according to claim 20,
wherein, in the store operation, according to the potentials of the pair of memory nodes, the depletion layer of the MIS transistor of either one of the pair of non-volatile resistance change elements increases in thickness thereby bringing the MIS transistor of the one resistance change element into the high resistance state, while the depletion layer of the MIS transistor of the other non-volatile resistance change element reduces in thickness thereby bringing the MIS transistor of the other resistance change element into the low resistance state; and
wherein, in the recall operation, either of the pair of memory nodes is placed at a high potential while the other memory node is placed at a low potential, according to the difference in resistance between the MIS transistors of the pair of non-volatile resistance change elements.

* * * * *